United States Patent
Najafi-Yazdi et al.

(10) Patent No.: US 10,622,998 B1
(45) Date of Patent: Apr. 14, 2020

(54) QUBIT CIRCUIT AND METHOD FOR TOPOLOGICAL PROTECTION

(71) Applicant: ANYON SYSTEMS INC., Dorval (CA)

(72) Inventors: Alireza Najafi-Yazdi, Vaudreuil-Dorion (CA); Gabriel Ethier-Majcher, Montreal (CA); Chloe Archambault, Verdun (CA)

(73) Assignee: ANYON SYSTEMS INC., Dorval (CA)

(*) Notice: Subject to any disclaimer, the term of this patent is extended or adjusted under 35 U.S.C. 154(b) by 0 days.

(21) Appl. No.: 16/592,457

(22) Filed: Oct. 3, 2019

Related U.S. Application Data

(60) Provisional application No. 62/812,393, filed on Mar. 1, 2019, provisional application No. 62/740,450, filed on Oct. 3, 2018.

(51) Int. Cl.
| | | |
|---|---|---|
| *G06N 10/00* | (2019.01) | |
| *H03K 19/003* | (2006.01) | |
| *H01L 39/02* | (2006.01) | |
| *H01L 27/18* | (2006.01) | |
| *H01L 39/22* | (2006.01) | |

(52) U.S. Cl.
CPC ....... *H03K 19/00346* (2013.01); *G06N 10/00* (2019.01); *H01L 27/18* (2013.01); *H01L 39/025* (2013.01); *H01L 39/223* (2013.01)

(58) Field of Classification Search
CPC ... H03K 19/00346; H01L 27/18; G06N 10/00
See application file for complete search history.

(56) References Cited

U.S. PATENT DOCUMENTS

| | | | |
|---|---|---|---|
| 7,109,593 B2 | 9/2006 | Freedman et al. | |
| 7,518,138 B2 | 4/2009 | Freedman et al. | |
| 8,581,227 B2 | 11/2013 | Freedman et al. | |
| 9,489,634 B2 | 11/2016 | Bonderson | |
| 2017/0212860 A1* | 7/2017 | Naaman | G06F 13/4027 |
| 2018/0032894 A1* | 2/2018 | Epstein | G06N 10/00 |

OTHER PUBLICATIONS

Zippilli et al.: "Simulating long-distance entanglement in quantum spin chains by superconducting flux qubits", arXiv:1410.5444v2, Jan. 22, 2015, pp. 1-12.

You et al.: "Encoding a qubit with Majorana modes in superconducting circuits", Scientific Reports, 4: 5535, DOI: 10.1038, Jul. 2, 2014, pp. 1-8.

(Continued)

*Primary Examiner* — Seokjin Kim
(74) *Attorney, Agent, or Firm* — Norton Rose Fulbright Canada LLP

(57) ABSTRACT

A qubit circuit and a method for topological protection of a qubit circuit are described. The circuit comprises a plurality of physical superconducting qubits and a plurality of coupling devices interleaved between pairs of the physical superconducting qubits. The coupling devices are tunable to operate the qubit circuit either in a topological regime or as a series of individual physical qubits. At least two superconducting loops, each one threadable by an external flux, are part of the qubit circuit.

20 Claims, 21 Drawing Sheets

(56) References Cited

OTHER PUBLICATIONS

Mao et al.: "Quantum Simulation of Topological Majorana Bound States and Their Universal Quantum Operations Using Charge-Qubit Arrays", arXiv:1403.4365v2, Sep. 4, 2018, pp. 1-5.
Levitov et al.: "Quantum spin chains and Majorana states in arrays of coupled qubits", arXiv:cond-mat/0108266v2, Aug. 19, 2001, pp. 1-7.
Hu et al.: "Realizing universal quantum gates with topological bases in quantum-simulated superconducting chains", npj Quantum Information (2017) 8, Mar. 6, 2017, pp. 1-6.
Dong et al.: "Signatures of topological quantum phase transitions in driven and dissipative qubit-arrays", arXiv:1604.04770v1, Apr. 16, 2016, pp. 1-10.
Backens et al.: "Emulating Majorana fermions and their braiding by Ising spin chains", arXiv:1703.08224v3, Nov. 1, 2017, pp. 1-13.
Chen et al.: "Qubit Architecture with High Coherence and Fast Tunable Coupling", Physical Review Letters 113.22, Nov. 26, 2014, pp. 1-5.
Chen: "Metrology of Quantum Control and Measurement in Superconducting Qubits", PhD Thesis, university of California, Jan. 2018, 241 p.
Geller et al.: "Tunable coupler for superconducting Xmon qubits: Perturbative nonlinear model", Physical Review A 92, 012320 (2015), American Physical Society, Jul. 17, 2015, pp. 1-9.
Mooij et al.: "Josephson Persistent-Current Qubit", Science, vol. 285, www.sciencemag.org, Aug. 13, 1999, pp. 1036-1039.
Neill et al.: "A blueprint for demonstrating quantum supremacy with superconducting qubits", arXiv:1709.06678v1, Sep. 19, 2017, 22 p.
Orlando et al.: "A Superconducting Persistent Current Qubit", arXiv:cond-mat/9908283v2, Feb. 1, 2008, pp. 1-15.
Schwarz et al.: "Gradiometric flux qubits with a tunable gap", New Journal of Physics 15 (2013) 045001, Apr. 4, 2013, pp. 1-21.
Yoshihara et al.: "Superconducting qubit-oscillator circuit beyond the ultrastrong-coupling regime", Nature Physics 13.1, 2017, pp. 1-29.
Casanova et al.: "Deep Strong Coupling Regime of the Jaynes-Cummings model", arXiv:1008.1240v3, Oct. 22, 2018, pp. 1-4.

* cited by examiner

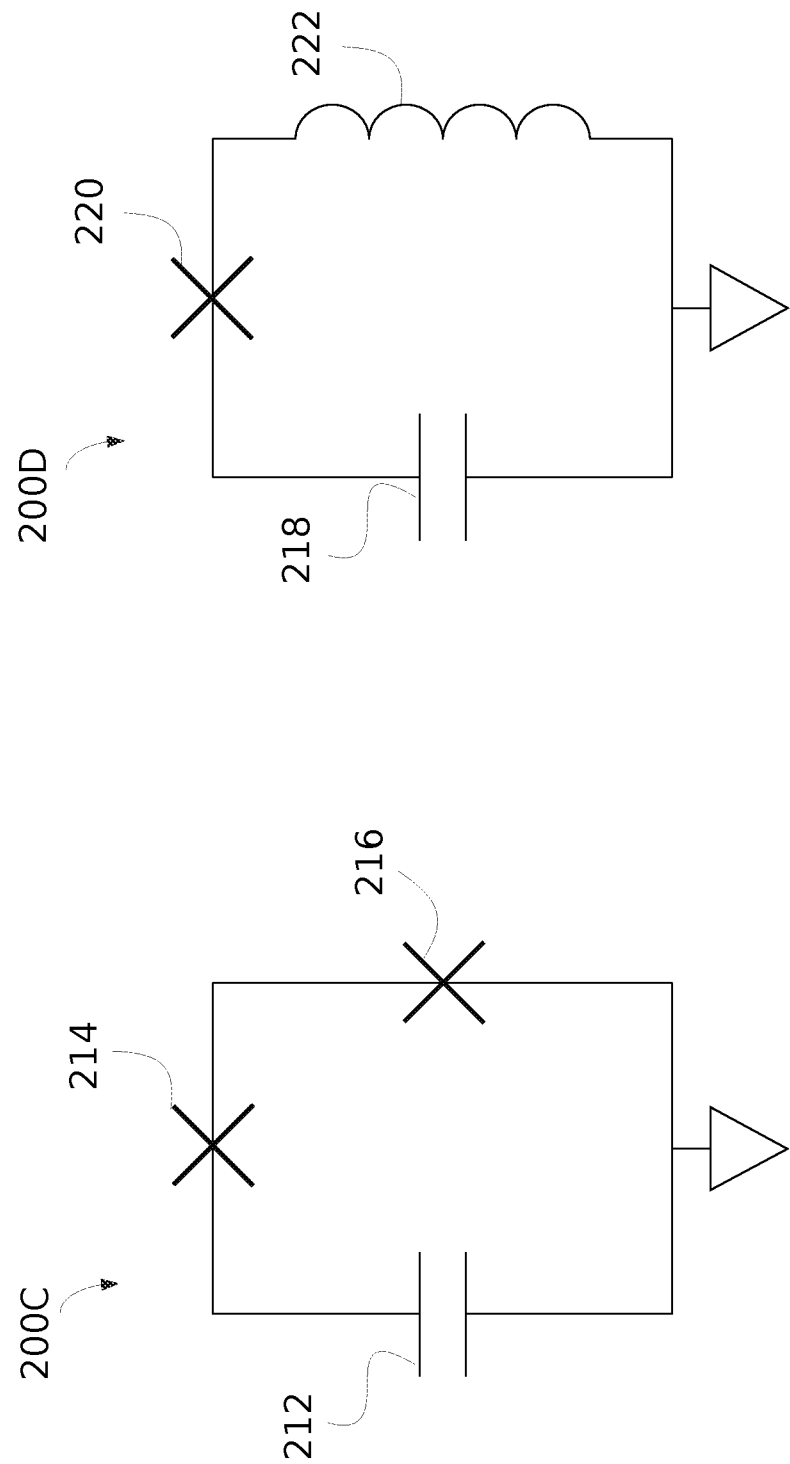

QUBIT CIRCUIT AND METHOD FOR TOPOLOGICAL PROTECTION

CROSS-REFERENCE TO RELATED APPLICATIONS

The present application claims the benefit of U.S. Provisional Patent Application No. 62/740,450 filed on Oct. 3, 2018, and on U.S. Provisional Patent Application No. 62/812,393 filed on Mar. 1, 2019, the contents of which are hereby incorporated by reference in their entirety.

TECHNICAL FIELD

The present disclosure relates generally to quantum computation, and more particularly to superconducting topological qubits protected from noise.

BACKGROUND OF THE ART

Superconducting qubits are one of the most promising candidates for developing commercial quantum computers. Indeed, superconducting qubits can be fabricated using standard microfabrication techniques. Moreover they operate in the few GHz bandwidth such that conventional microwave electronic technologies can be used to control qubits and readout the quantum states.

A significant challenge in quantum computation is the sensitivity of the quantum information to noise. The integrity of the quantum information is limited by the coherence time of the qubits and errors in the quantum gate operations which are both affected by the environmental noise.

One manner to address this issue is to design and use topological qubits, which are intrinsically protected against noise. Topological qubits employ quasiparticles called anyons, and more specifically non-Abelian anyons. However, non-Abelian anyons have not yet been found in nature. This has hindered the development of topological quantum computers.

SUMMARY

In accordance with a broad aspect, there is provided a topological superconducting qubit circuit. The circuit comprises a plurality of physical superconducting qubits and a plurality of coupling devices interleaved between pairs of the physical superconducting qubits. The coupling devices are tunable to operate the qubit circuit either in a topological regime or as a series of individual physical qubits. At least two superconducting loops, each one threadable by an external flux, are part of the qubit circuit.

In various embodiments, the circuit further comprises at least one component for generating a magnetic field for inducing the external flux in the superconducting loops.

In various embodiments, the component comprises two transmission lines, each one coupled to one of the superconducting loops through a mutual inductance.

In various embodiments, each one of the physical superconducting qubits is composed of at least one capacitor and at least one Josephson junction connected together.

In various embodiments, the Josephson junction is part of a SQUID.

In various embodiments, the capacitor and the Josephson junction are connected together at a first node, and the coupling devices are connected to the physical qubits at the first node.

In various embodiments, one of the superconducting loops comprises a second node having the same superconducting phase as the first node.

In various embodiments, the capacitor and the Josephson junction are connected together at a first node, and the coupling devices are connected to the physical qubits at a second node different from the first node.

In various embodiments, one of the superconducting loops comprises a third node having the same superconducting phase as the second node.

In various embodiments, one of the superconducting loops is a loop of superconducting material interrupted by a SQUID.

In various embodiments, another one of the superconducting loops is interrupted by a Josephson junction of the SQUID.

In accordance with another broad aspect, there is provided a method for topological protection of quantum information in a qubit circuit. The method comprises coupling a plurality of physical qubits with a plurality of interleaved coupling devices, each one of the coupling devices comprising at least one superconducting loop threadable by an external flux $\phi_{ext}$. Parameters for the external flux $\phi_{ext}$ are selected such that $$\left|\frac{J}{h}\right| > 1,$$

where J is a coupling device energy and h is a physical qubit energy. The external flux $\phi_{ext}$ is applied to the superconducting loop to induce a phase shift in the coupling devices and to operate the qubit circuit in a topological regime.

In various embodiments, selecting parameters for the external flux $\phi_{ext}$ comprises selecting $\phi_{ext}$ to induce a phase shift with a value between $\pi/2$ and $3\pi/2$ (mod $2\pi$) in at least one Josephson junction of the qubit circuit.

In various embodiments, selecting parameters for the external flux $\phi_{ext}$ comprises selecting $\phi_{ext}$ to induce a phase shift of $\phi$ (mod $2\phi$) in at least one Josephson junction of the qubit circuit.

In various embodiments, the method further comprises applying an external flux $\phi_{SQUID}$ to the second superconducting loop of at least one of the plurality of coupling devices.

In various embodiments, applying the external flux $\phi_{SQUID}$ comprises applying the external flux $\phi_{SQUID}$ to the second superconducting loop of all of the plurality of coupling devices.

In various embodiments, the method further comprises selecting parameters for $\phi_{SQUID} = (2n+1)/2 * \phi_o$, where n is an integer and $\phi_o$ is a flux quantum.

In various embodiments, the method further comprises modulating $\phi_{SQUID}$ for at least one of the plurality of coupling devices.

In various embodiments, modulating $\phi_{SQUID}$ comprises changing $\phi_{SQUID}$ adiabatically.

In various embodiments, modulating $\phi_{SQUID}$ comprises changing $\phi_{SQUID}$ from $(2n+1)/2 * \phi_o$ to another value.

Features of the systems, devices, and methods described herein may be used in various combinations, in accordance with the embodiments described herein.

BRIEF DESCRIPTION OF THE DRAWINGS

Reference is now made to the accompanying Figs. in which:

FIGS. 2A-2D are example embodiments of physical qubits for the qubit circuit of FIG. 1;

It will be noted that throughout the appended drawings, like features are identified by like reference numerals.

DETAILED DESCRIPTION

The present disclosure comprises circuits and methods for topological quantum computing using superconducting qubits. In various embodiments, a topological qubit comprises a plurality of physical superconducting qubits and a plurality of coupling devices which are interleaved between the physical qubits.

A superconducting circuit is described which can be used to artificially engineer non-Abelian anyon quasi-particle dynamics. Such a circuit may be used in developing a topological quantum processor.

Figure 1:
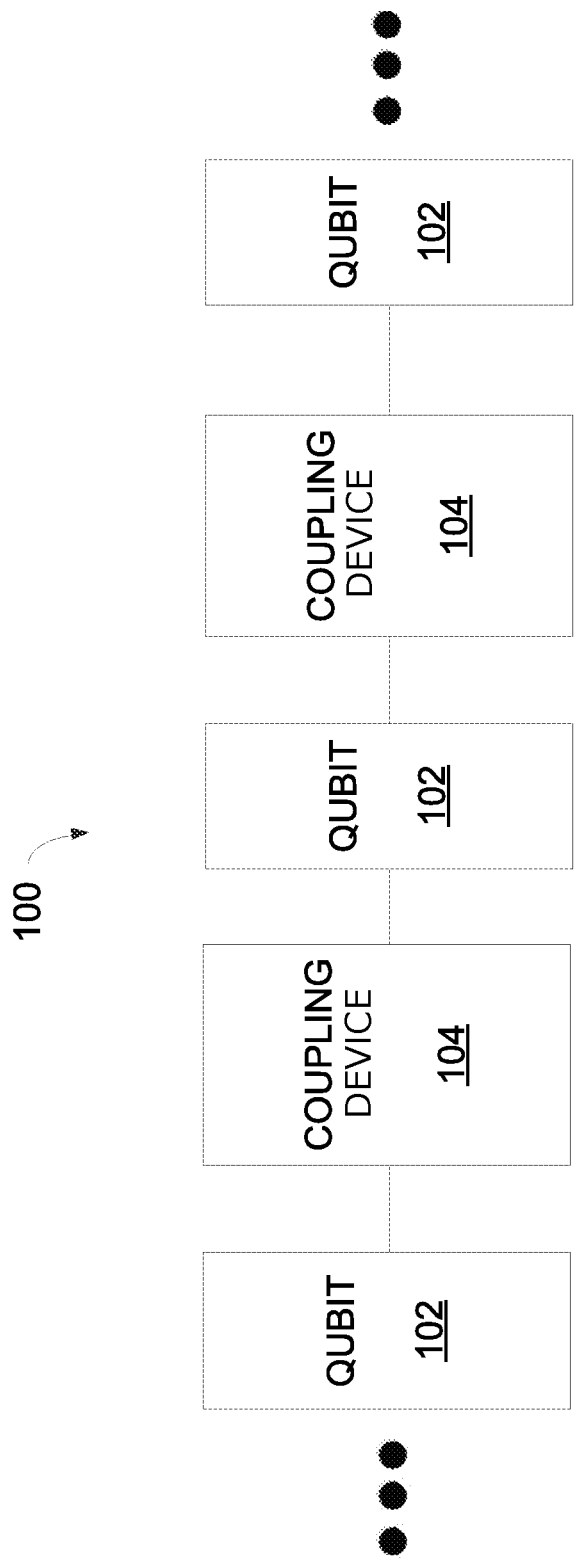
FIG. 1 is a block diagram of an example embodiment of a qubit circuit.

For various operations of a quantum computer, such as anyon creation, braiding, and fusion, one may need to control the strength of the coupling between the physical qubits. Accordingly, a tunable qubit circuit for topological protection 100 is described herein and illustrated in FIG. 1. The circuit 100 is composed of a plurality of physical qubits 102 coupled together with coupling devices 104. The coupling devices 104 are interleaved between pairs of physical qubits 102, i.e a first qubit 102 is connected to a second qubit 102 by a coupling device 104, the second qubit 102 is connected to a third qubit 102 by a coupling device 104, the third qubit 102 is connected to a fourth qubit 102 by a coupling device 104, and so on.

In some embodiments, a physical qubit 102 may be coupled to one or more other physical qubits 102 through corresponding coupling devices 104, thus creating a network of physical qubits which can support different configurations of topological qubits. Changing the configuration of the topological qubits is possible due to the tunability of the coupling devices interleaved between the physical qubits. All of the qubits 102 in the circuit 100 may be of a same configuration. Alternatively, qubits 102 of the circuit 100 may have different configurations. All of the coupling devices 104 of the circuit 100 may be of a same configuration. Alternatively, coupling devices 104 of the circuit 100 may have different configurations. Although three qubits 102 and two coupling devices 104 are illustrated, these numbers are for illustrative purposes only.

The qubits 102 may be composed of at least one capacitor and at least one Josephson junction connected together. In some embodiments, the qubits are transmon qubits, which are a specific type of superconducting qubit composed of at least one Josephson junction and at least one capacitor.

Figure 2B:
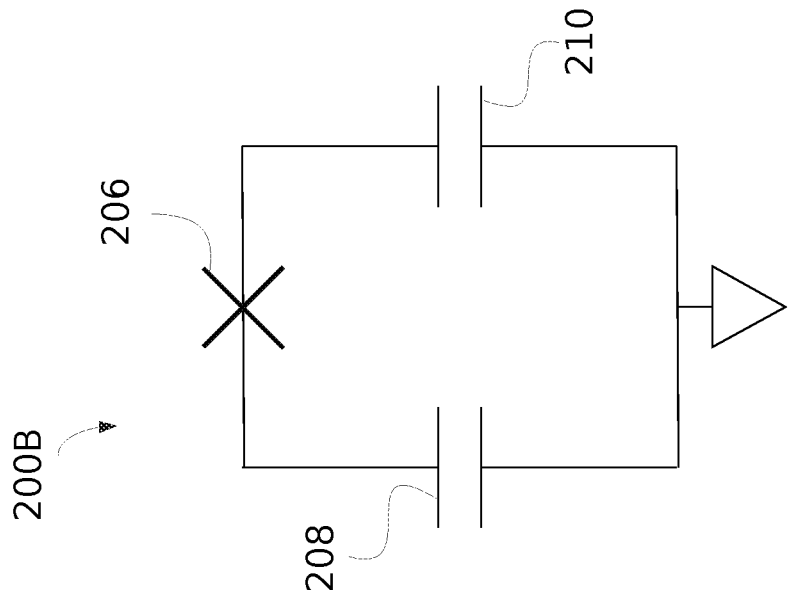
Figure 2A:
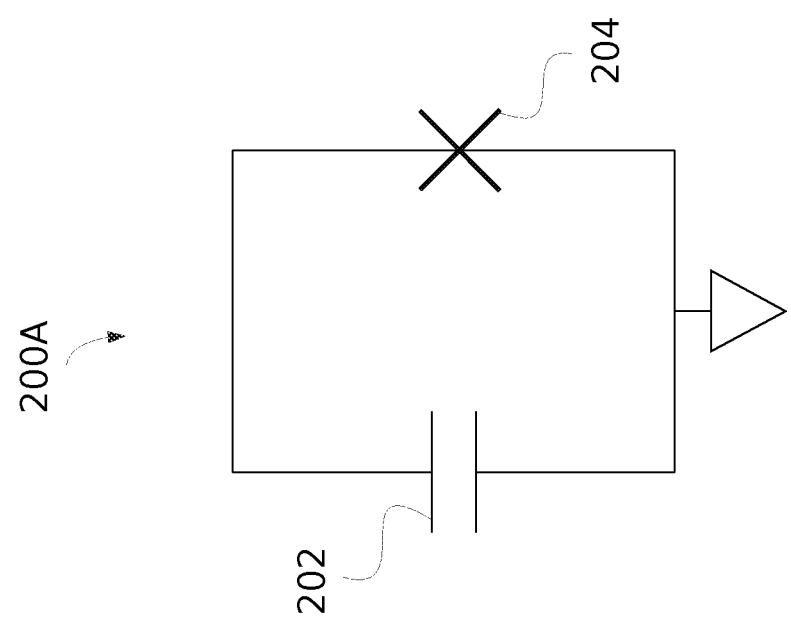

Example embodiments for the qubits 102 are shown in FIGS. 2A-2D. FIG. 2A illustrates a qubit 200A having a capacitor 202 and a Josephson junction 204 connected together in parallel. FIG. 2B illustrates a qubit 200B having a Josephson junction 206 connected between a first capacitor 208 and a second capacitor 210. This configuration is referred to as a differential architecture. FIG. 2C illustrates a qubit 200C having a capacitor 212 connected in series with a first Josephson junction 214 and a second Josephson junction 216. This configuration is referred to as a two-junction architecture. FIG. 2D illustrates a qubit 200D having a Josephson junction 220 connected in series between a capacitor 218 and an inductor 222. This configuration is referred to as an inductively shunted architecture. Each Josephson junction 204, 206, 214, 216, 220 may be replaced by a pair of Josephson junctions connected in parallel, referred to herein as a SQUID (superconducting quantum interference device), for tunability of the frequency of the qubits 102.

The total energy of a circuit 100 having N qubits 102 may be found from its Hamiltonian. One can use the Jordan-Wgner transformation to show that circuit 100, designed with proper coupling devices 104, has a similar Hamiltonian to an Ising spin chain that behaves like a topological quantum system supporting Majorana edge states, which are one type of non-Abelian quasi-particles. In the Ising spin chain model, the Hamiltonian of a chain of N coupled qubits is written as:

$$H = -\sum_{i=1}^{N} h\sigma_i^z - \sum_{i=1}^{N-1} J\sigma_i^x \sigma_{i+1}^x, \qquad (1)$$

where the $\sigma_i$ are the Pauli operators on qubit i. The first term relates to the energy of the qubits 102. The second term represents the energy of the coupling between two qubits 102. The coupling is said to be of ferromagnetic type for J>0 (and antiferromagnetic type for J<0). A phase transition from a non-topological phase to a topological phase occurs when the coupling energy becomes larger than the qubit energy. In other words, the condition for achieving topological protection is $$\left| \frac{J}{h} \right| > 1.$$

When this condition is met, we refer to the circuit 100 as having "deep strong coupling". A circuit having deep strong coupling is said to operate in a topological regime.

Figure 3A:
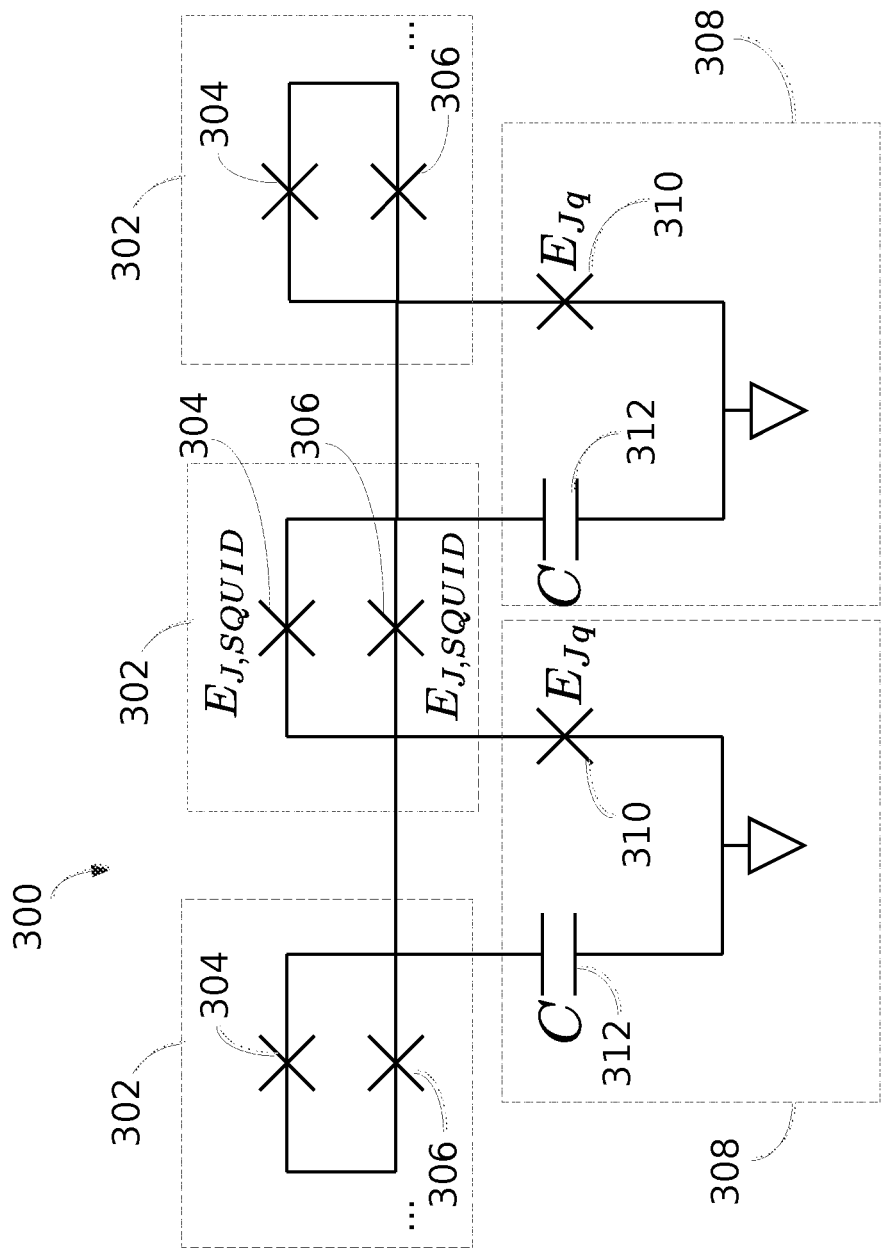
FIGS. 3A-B illustrate an example of a qubit circuit using SQUIDs as coupling devices.

FIG. 3A illustrates an example embodiment of the qubit circuit 300, where coupling devices 302 are SQUIDS. The coupling devices 302 are composed of two Josephson junctions 304, 306, connected in parallel. Two physical qubits 308 are as per the embodiment of FIG. 2A, with a Josephson junction 310 of Josephson energy $E_{Jq}$ and a capacitor 312 of capacitance C.

Figure 3B:
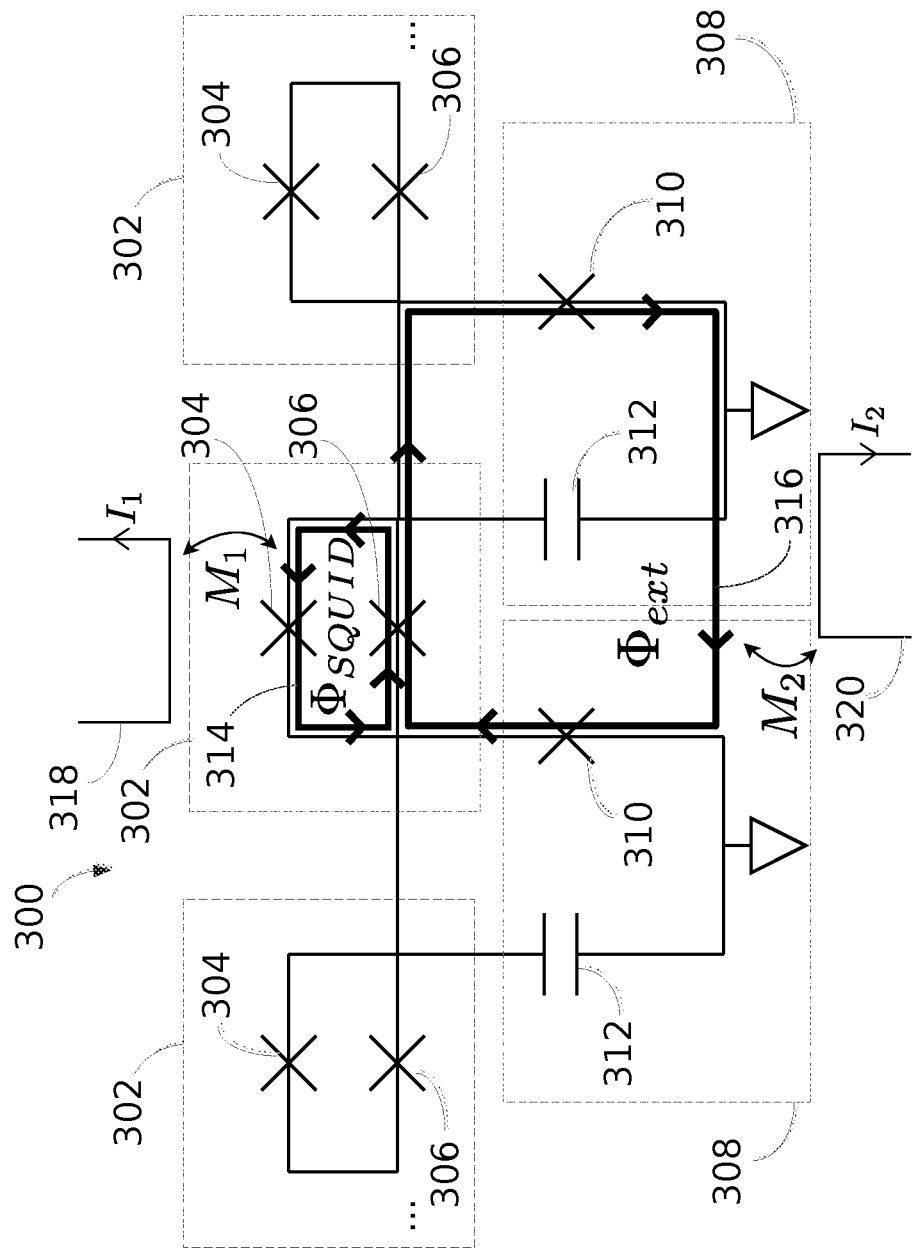

Referring to FIG. 3B, two superconducting loops 314, 316 are illustrated for the circuit 300. A superconducting loop is formed by a loop of superconducting material which may be interrupted by one or more Josephson junctions. A loop of superconducting material forms a closed path in a circuit, and the path lies in the superconducting material. Magnetic flux in a loop of superconducting material is quantized, and flux quantization is maintained even if the loop of superconducting material is interrupted by one or more Josephson junctions. Generally, a circuit of N coupling devices will have 2×N superconducting loops, although more than two loops may be provided per coupling device in the circuit.

Each loop 314, 316 of circuit 300 is threadable by an external flux. The loop is said to be threadable by an external magnetic flux when a non-zero magnetic flux may be induced in the loop in a controlled fashion by an applied magnetic field passing through a surface defined by the loop. The magnetic field is generated by a component and/or device coupled to the loop. For example, the magnetic field can be generated by a current-carrying line such as a transmission line or a waveguide in proximity to the loop. Such current-carrying line is coupled to the loop through a mutual inductance and connected to a current source. An example is illustrated in FIG. 3B, where a line 318 is coupled to superconducting loop 314 through a mutual inductance $M_1$ and carrying a current $I_1$ that induces a flux oft $\Phi_{SQUID}$ in loop 314. Similarly, a line 320 coupled to superconducting loop 316 through a mutual inductance $M_2$ and carrying a current $I_2$ induces a flux $\Phi_{ext}$ in loop 316. Other embodiments may also apply.

A magnetic field is applied to the circuit 300 in order to induce a phase shift in the coupling devices 302, so as to obtain a deep strong coupling regime. The magnetic field induces a non-zero external flux $\Phi_{ext}$ threading loop 316.

A superconducting node phase $\phi_i$ and a charge number $n_i$ are assigned to each qubit 308, and the Hamiltonian of a chain of N qubits 308 is given by:

$$H = \sum_{i=1}^{N} [4E_C n_i^2 - E_{Jq}\cos\phi_i] - \sum_{i=1}^{N-1} E_{Jc}\cos(\phi_i - \phi_{i+1} - \phi_{ext}), \quad (2)$$

with $$\phi_{ext} = \frac{2\pi\Phi_{ext}}{\Phi_0}, E_C = \frac{e^2}{2C} \text{ and } E_{Jc} = 2E_{J,SQUID}\left|\cos\left(\frac{\pi\Phi_{SQUID}}{\Phi_0}\right)\right|$$

where $\Phi_o$ is the flux quantum, e the electron charge and $\Phi_{SQUID}$ the flux applied to the SQUID of the coupling devices 302. The cosine term involving $\phi_{ext}$ in the Hamiltonian can then be rewritten as:

$$\cos(\phi_i - \phi_{i+1} - \phi_{ext}) = \cos(\phi_i - \phi_{i+1})\cos\phi_{ext} + \sin(\phi_i - \phi_{i+1})\sin\phi_{ext} \quad (3)$$

Expanding the cosine and sine terms involving $\phi_i$ to second order Taylor series, the Hamiltonian becomes $$H = \sum_{i=1}^{N}\left[4E_C n_i^2 + (E_{Jq} + 2E_{Jc}\cos\phi_{ext})\frac{\phi_i^2}{2}\right] - \quad (4)$$

$$\sum_{i=1}^{N-1} E_{Jc}\cos(\phi_{ext})\phi_i\phi_{i+1} - \sum_{i=1}^{N-1} E_{Jc}\sin(\phi_{ext})(\phi_i - \phi_{i+1}).$$

The first term corresponds to the sum of the Hamiltonians of N transmon qubits having Josephson energy equal to $\tilde{E}_J = E_{Jq} + 2E_{Jc}\cos\phi_{ext}$ while the second term represents the coupling between nearest neighbours. The last term is an additional single-qubit term stemming from the external flux. For a finite chain, the two qubits at the ends of the chain have effective Josephson energies of $\tilde{E}_J = E_{Jq} + E_{Jc}\cos\phi_{ext}$. The effective qubit impedance and plasma frequency are defined as:

$$r = \sqrt{\frac{8E_c}{\tilde{E}_J}} \text{ and } \omega_p = \frac{\sqrt{8E_c\tilde{E}_J}}{\hbar}. \quad (5)$$

Rewriting the Hamiltonian in terms of the Pauli operators gives:

$$H = -\sum_{i=1}^{N} h\sigma_i^z - \sum_{i=1}^{N-1} J\sigma_i^x\sigma_{i+1}^x - \sum_{i=1}^{N-1} B_x(\sigma_i^x - \sigma_{i+1}^x), \quad (6)$$

with:

$$h = \frac{\hbar\omega_p}{2} = \frac{rE_J}{2}, \quad (7)$$

$$J = \frac{r}{2}E_{Jc}\cos\phi_{ext}, \quad (8)$$

$$B_x = \sqrt{\frac{r}{2}}E_{Jc}\sin\phi_{ext}. \quad (9)$$

In the Ising model, the condition for achieving topological protection is $$\left|\frac{J}{h}\right| > 1.$$

In the present case, that becomes:

$$|E_{Jc}\cos\phi_{ext}| > \tilde{E}_J. \quad (10)$$

If there is no external flux, i.e. $\phi_{ext}=0$, then the condition cannot be realised with $E_{Jc}$ and $E_{Jq}$ being positive. Deep strong coupling can only be satisfied if:

$$E_{Jc}\cos\phi_{ext} < \frac{-E_{Jq}}{3} \text{ and } \cos\phi_{ext} < 0. \quad (11)$$

Topological order is thus attainable with such a design if an external phase having a value between $\pi/2$ and $\pi/2$ is applied to the coupler. Coupling is maximal at $\phi_{ext}=\pi$, in which case the condition on the design becomes $E_{Jq}/3 < E_{Jc}$.

Figure 4:
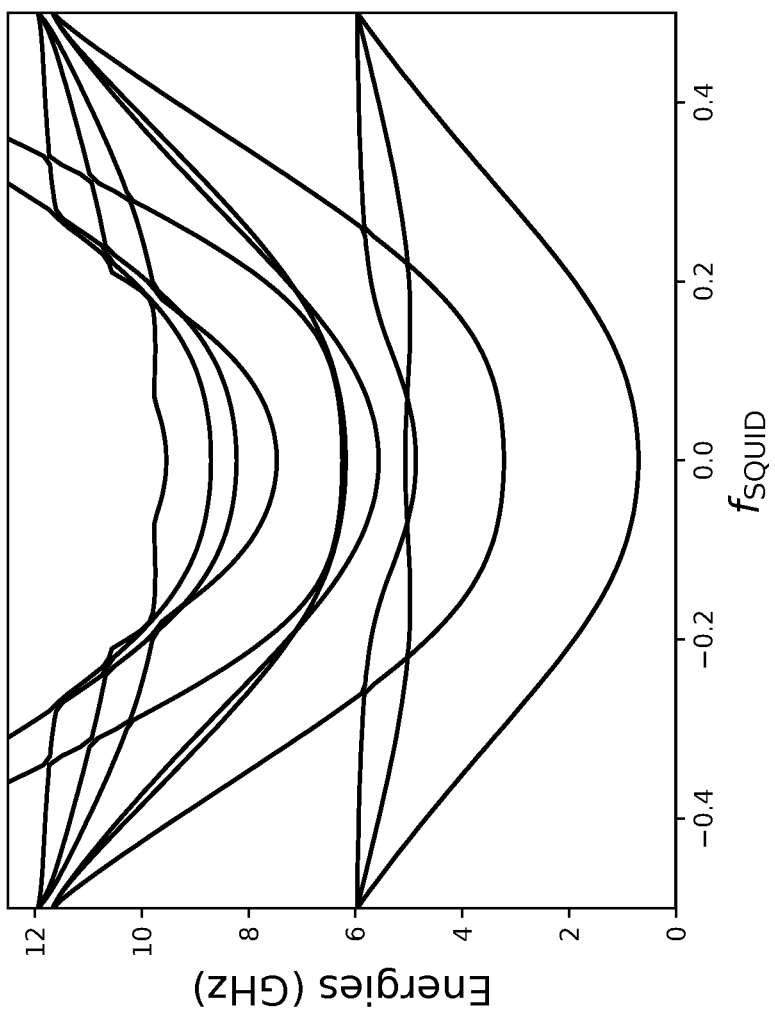
FIG. 4 is a graph of the energy spectrum of a 3-qubit circuit as a function of the magnetic frustration in the coupling SQUID, in accordance with some embodiments.

FIG. 4 shows simulation results for the energy levels of three qubits 308 coupled by two coupling devices 302 composed of SQUIDs. The external flux for the coupling devices 302 was set such that $\phi_{ext}=\pi$. FIG. 4 shows the energy spectrum with respect to the ground state energy when $E_{Jq}$=20 GHz, $E_{J,SQUID}$=4.5 GHz and C=80 fF as a function of the SQUID magnetic frustration $$f_{SQUID} = \frac{\Phi_{SQUID}}{\Phi_0}.$$

We can see that the separation between the ground state and the first excited state decreases from 6 GHz to less than 1 GHz when $f_{SQUID}$ approaches zero, where the coupling is maximal. Moreover, the derivative of the energy levels is zero at the maximal coupling point for $f_{SQUID}$=0.

Figure 5:
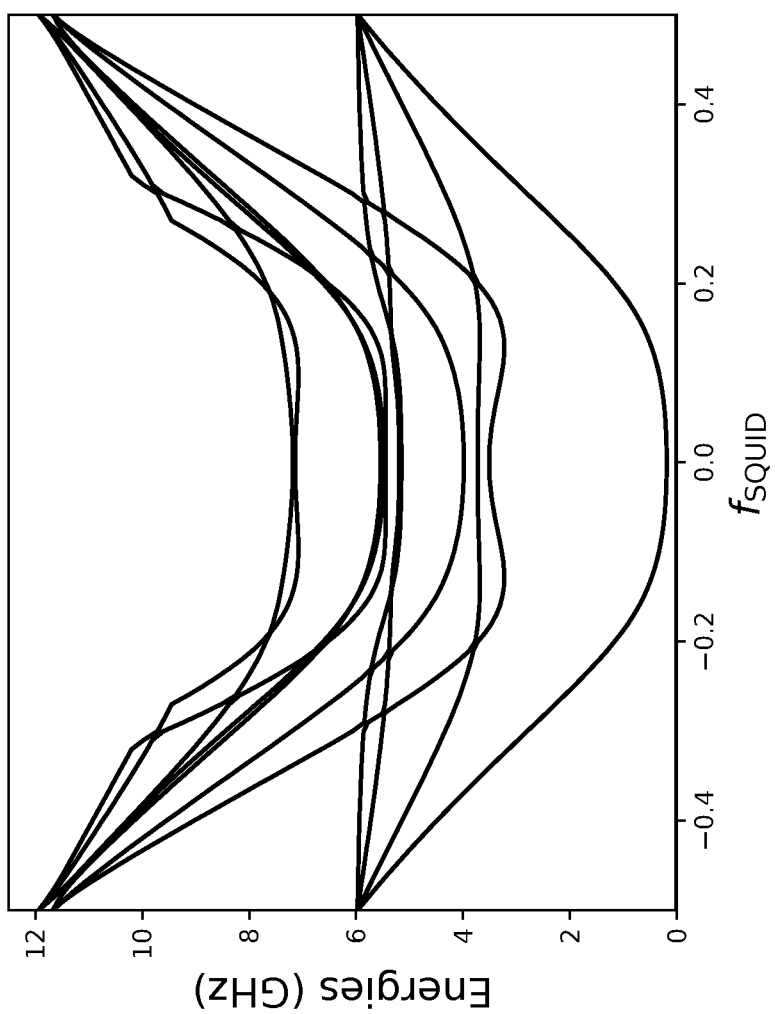
FIG. 5 is a graph of the energy spectrum of a 4-qubit circuit as a function of the magnetic frustration in the coupling SQUID, in accordance with some embodiments.
Figure 6:
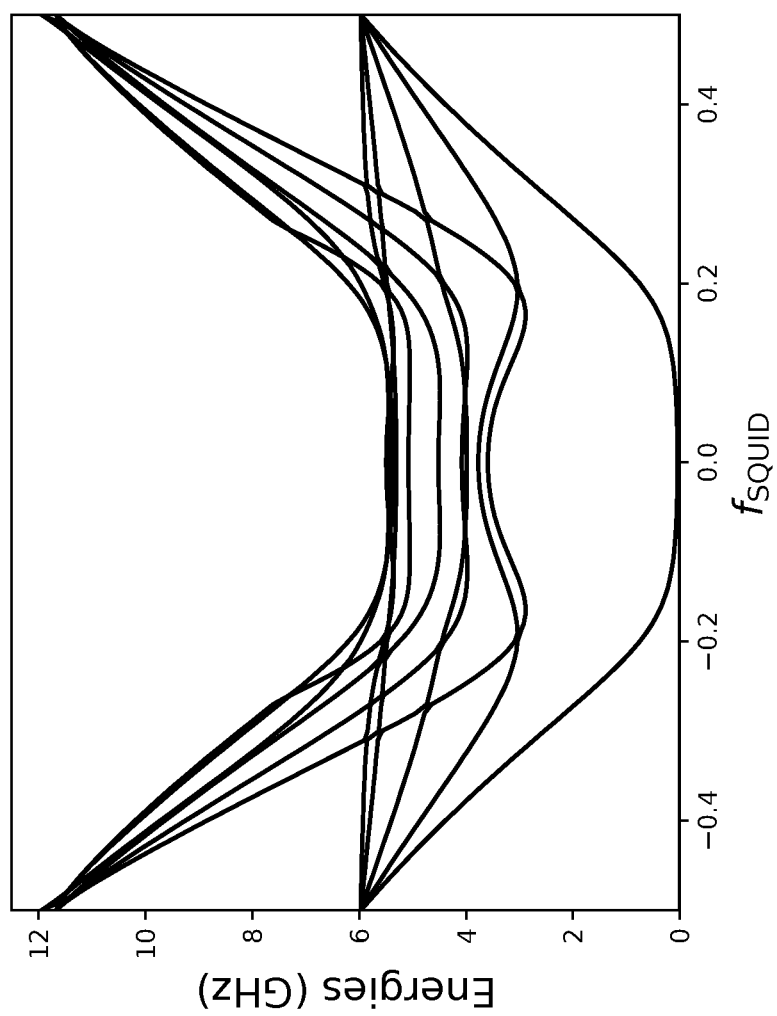
FIG. 6 is a graph of the energy spectrum of a 5-qubit circuit as a function of the magnetic frustration in the coupling SQUID, in accordance with some embodiments.

The calculated spectrum with four and five qubits 308 is shown in FIG. 5 and FIG. 6 respectively. Increasing the number of qubits 308 reduces the energy splitting between the ground state and the first excited state at maximal coupling. With five qubits 308, the two states are almost degenerate at the $f_{SQUID}$=0 operating point. Degenerate ground states are indeed characteristic of a topological state in the Ising model.

Figure 7A:
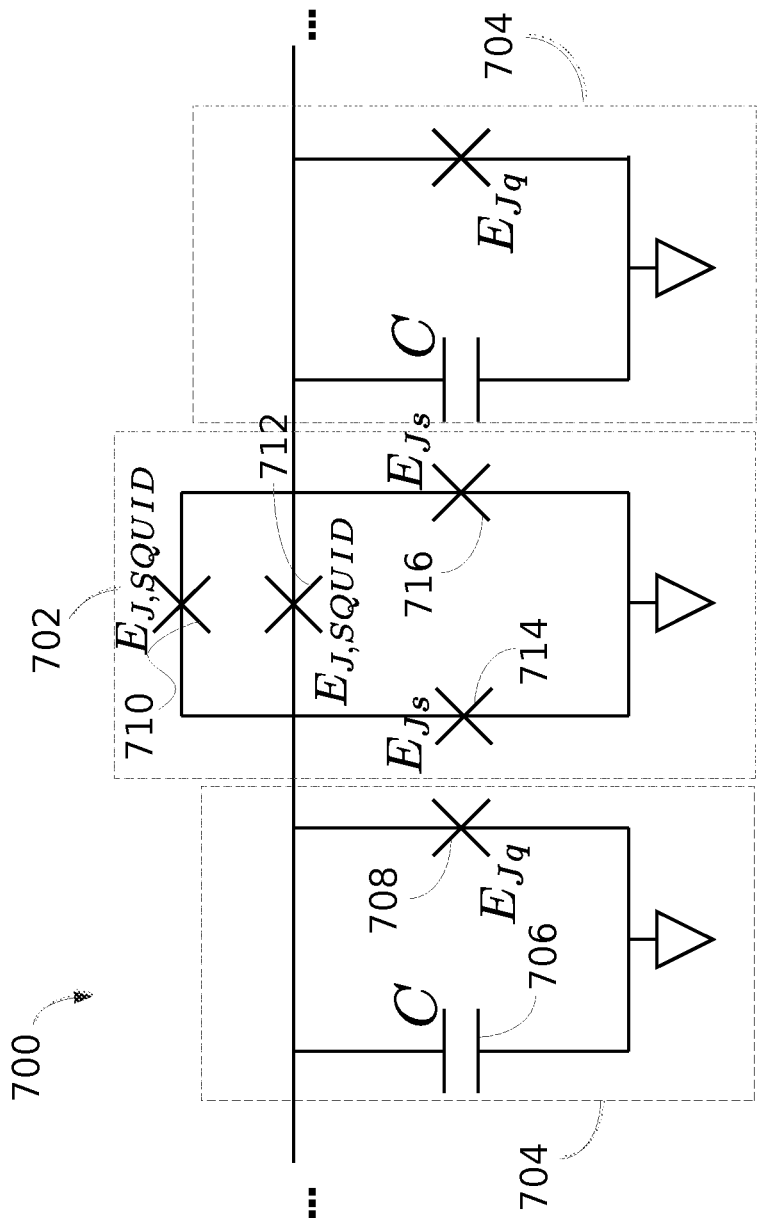
FIGS. 7A-B illustrate an example of a qubit circuit using flux qubits as coupling devices.
Figure 7B:
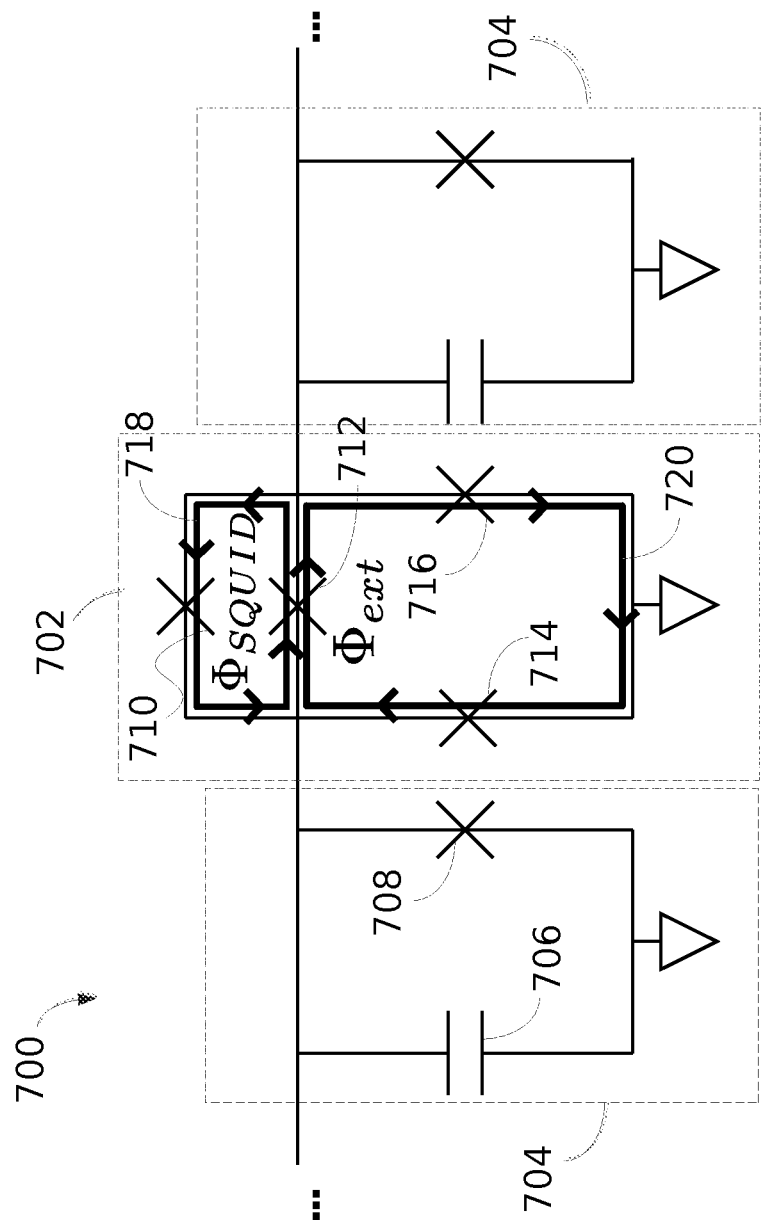

FIG. 7A illustrates an example circuit 700 with a coupling device according to another embodiment. A tunable flux qubit 702 is used to couple two qubits 704, composed of capacitor 706 and junction 708. The coupling strength of the tunable flux qubit 702 used as a coupling device can be tuned by applying a flux on the SQUID formed by the two $E_{J,SQUID}$ junctions 710, 712. In FIG. 7B, two superconducting loops 718, 720 are illustrated. By using two junctions 714, 716, the loop 720 threaded by the external magnetic flux $\Phi_{ext}$ is decoupled from the qubits 704, which may minimize unintentional driving of the qubits 704.

Noting that the junction 708 and junction 714 form an asymmetric SQUID with zero flux, we can simply replace $E_{Jq}$ by $E_{Jq}+E_{Js}$ in equation (2) to find that the same Hamiltonian as the one presented above governs the embodiment of FIGS. 7A-7B, and the conditions for deep strong coupling become:

$$E_{Jc}\cos\phi_{ext} < \frac{-(E_{Jq}+E_{Js})}{3} \text{ and } \cos\phi_{ext} < 0. \quad (12)$$

Replacing the junctions 714 and 716 by superconducting inductors would lead to a similar result.

Figure 8A:
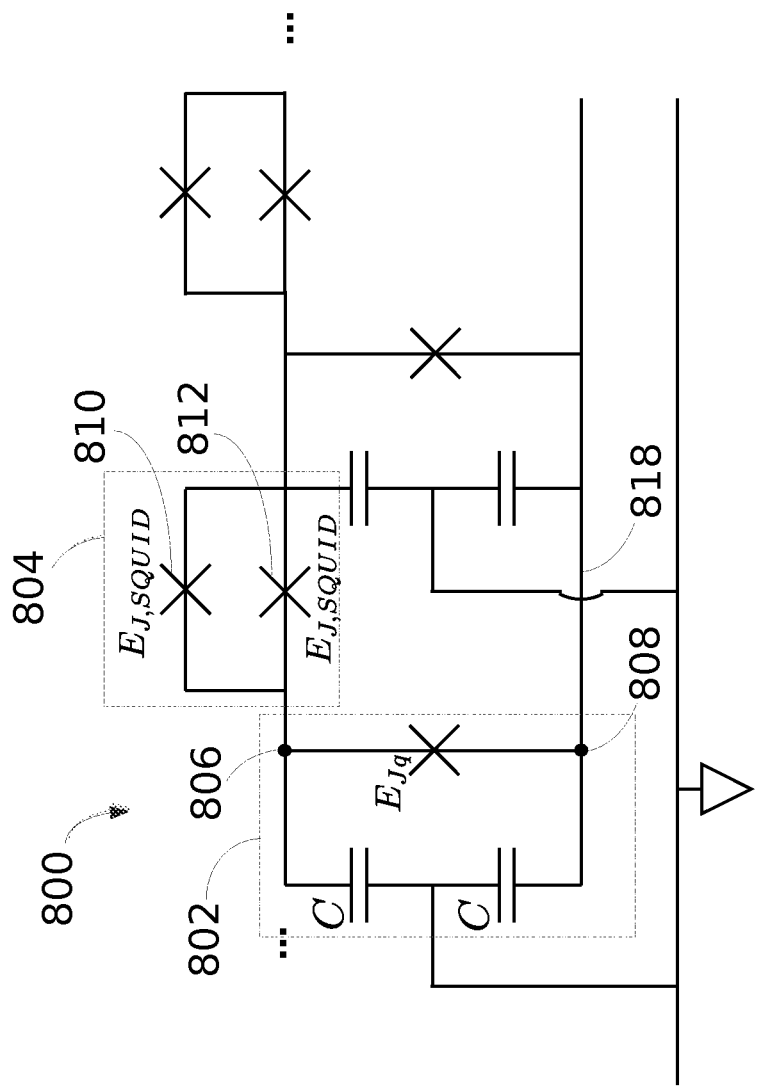
FIGS. 8A-C illustrate examples of qubit circuits using SQUIDS as coupling devices with differential qubits.
Figure 8B:
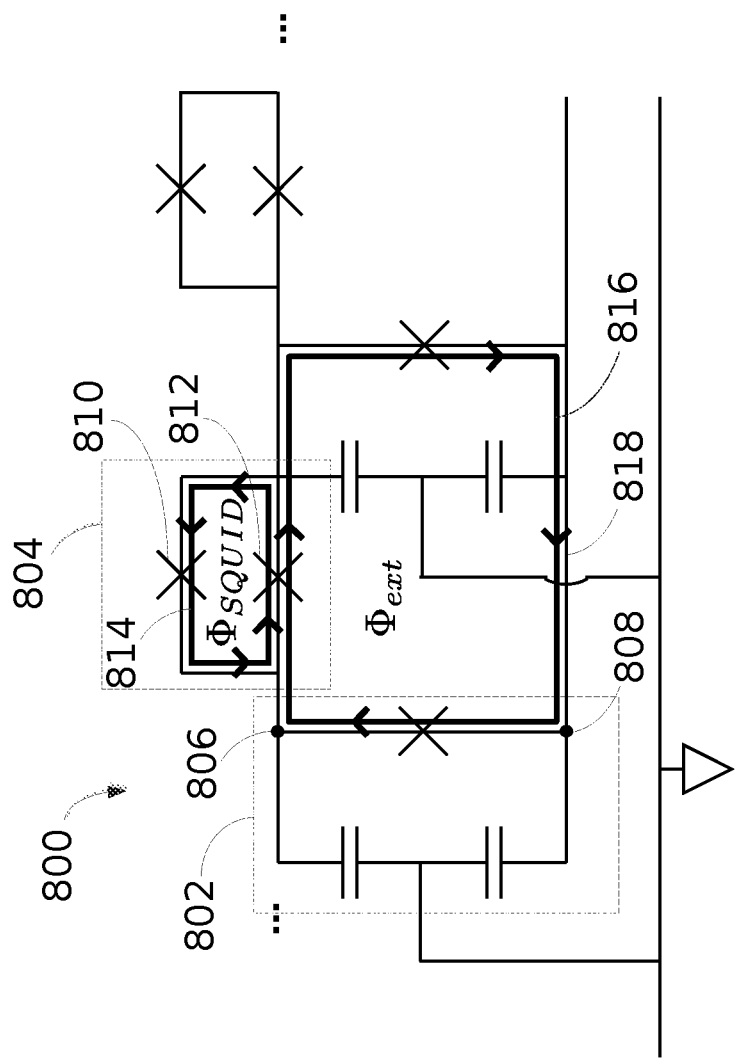

FIG. 8A illustrates an embodiment of a qubit circuit 800 with differential qubits 802 coupled with a coupling device 804. The qubits 802 are coupled at one node 806 through a SQUID (junctions 810, 812) and at another node 808 by a superconducting line 818. As shown in FIG. 8B, superconducting loops 814, 816 are present. An external flux $\phi_{ext}$ is threaded in loop 816.

The circuit 800 has the same Hamiltonian as the circuit 300 when the capacitance is replaced by C/2 such that $$E_C = \frac{e^2}{C}$$

in equation (2). The condition for reaching topological order is the same.

Figure 8C:
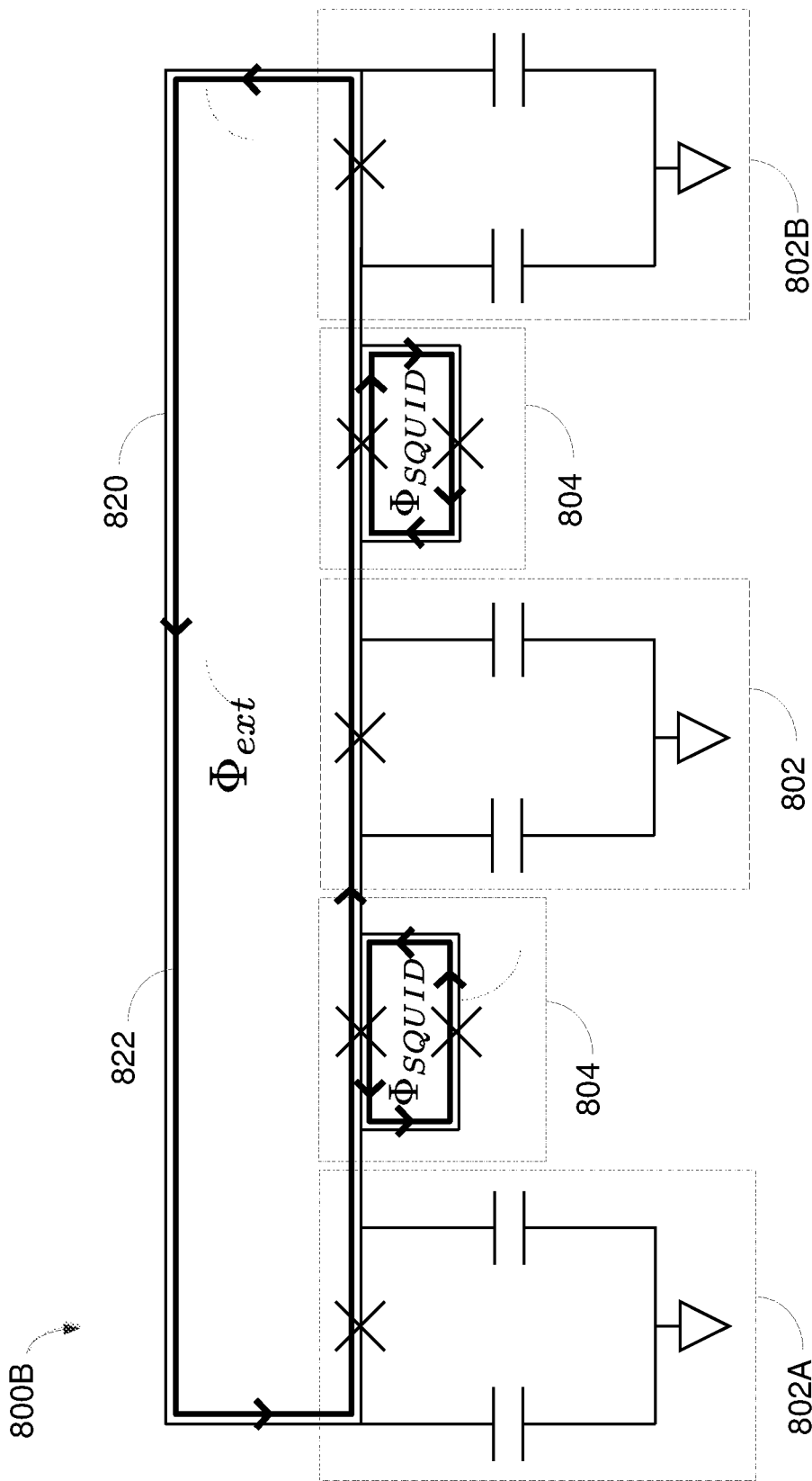

FIG. 8C illustrates an embodiment for a qubit circuit 800B using the same differential qubits 802 and coupling devices 804 as qubit circuit 800. The superconducting lines 818 (from circuit 800) between adjacent qubits are replaced by a single superconducting line 820 between the first qubit 802A and the last qubit 802B. Hence, superconducting loops 816 (from circuit 800) are replaced by a single superconducting loop 822 that spans the entire chain of qubits. The external flux $\phi_{ext}$ threading loop 822 can be selected to induce a desired phase shift in the coupling devices 804.

Figure 9A:
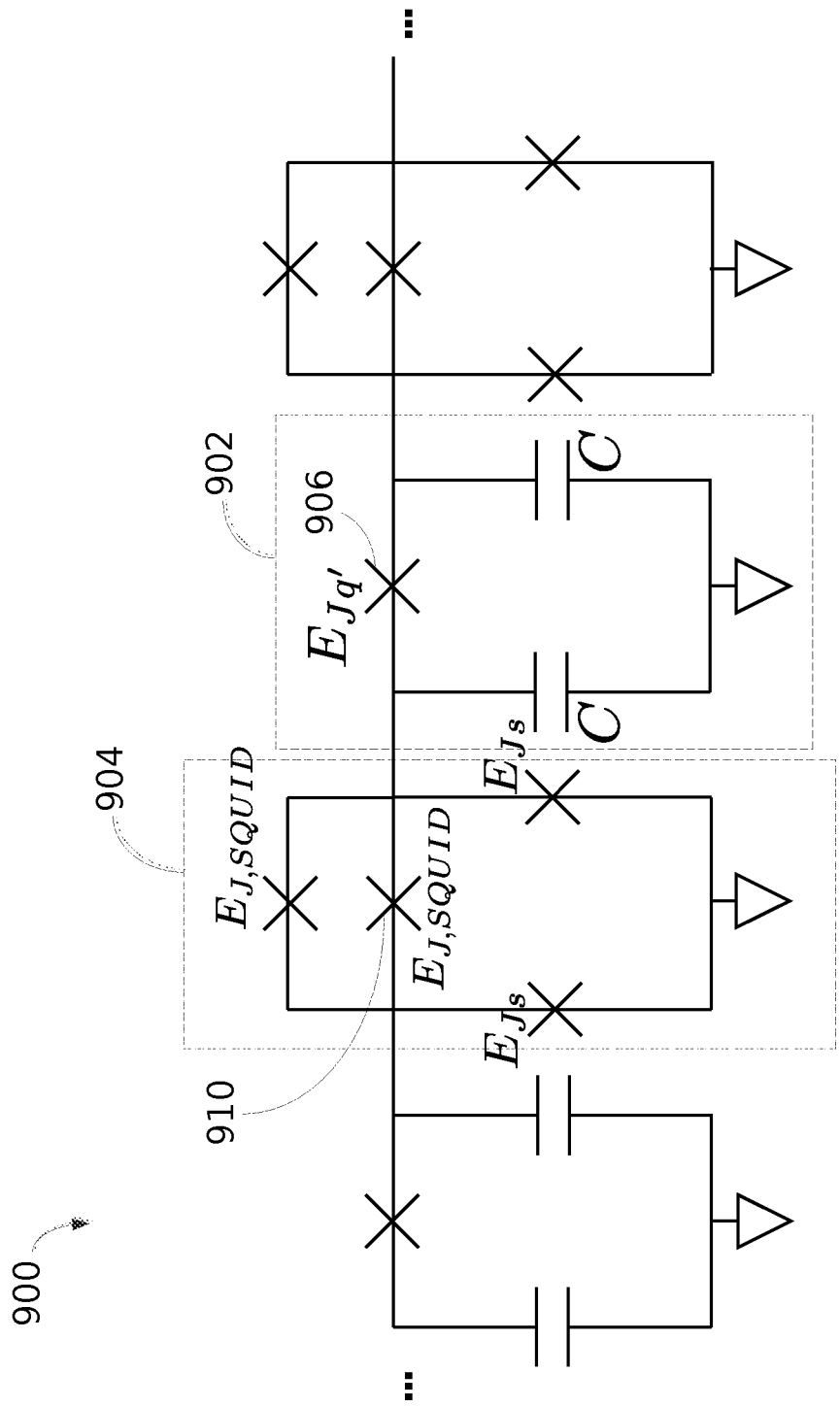
FIGS. 9A-B illustrate an example of a qubit circuit using flux qubits as coupling devices with differential qubits.
Figure 9B:
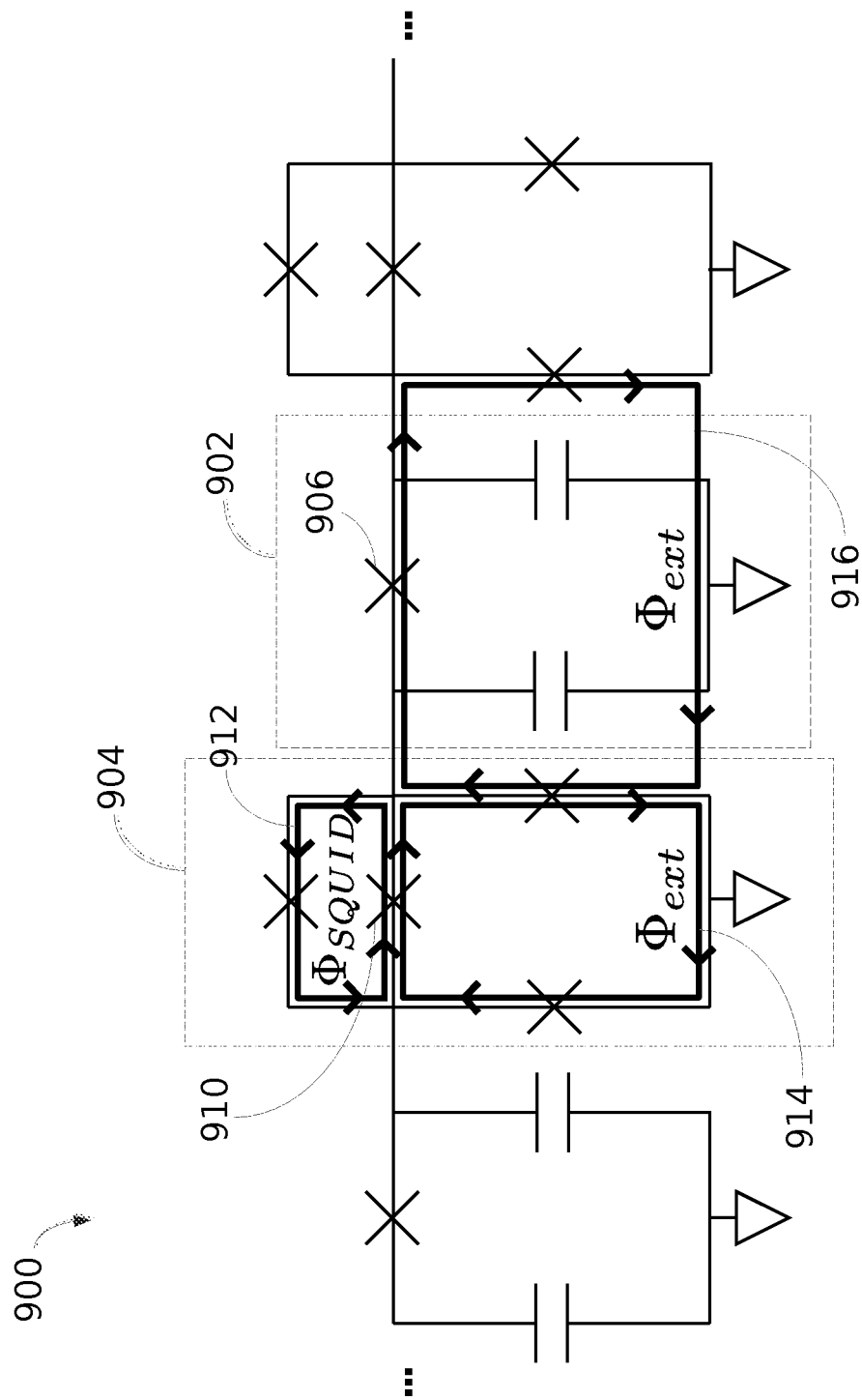

FIG. 9A illustrate a qubit circuit 900 with differential qubits 902 coupled with coupling device 904. FIG. 9B illustrates three superconducting loops 912, 914, 916 formed in the circuit 900.

The Hamiltonian of the circuit 900 is the same as the Hamiltonian of the circuit 300 if we set $$E_{Jq'} = 2E_{J,SQUID}\left|\cos\left(\frac{\pi\Phi_{SQUID}}{\Phi_0}\right)\right|$$

and replace $E_{Jq}$ and $E_{Jc}$ in equation (2) by $E_{Js}$ and $E_{Jq'}$, respectively. By inducing a phase shift of $\pi$ in junction 906 and junction 910 using external fluxes, the condition for deep strong coupling becomes $E_{Js}/3 < E_{Jq'}$. Note that for tunability, the $E_{Jq'}$ junction 906 may be implemented as a SQUID.

Figure 10A:
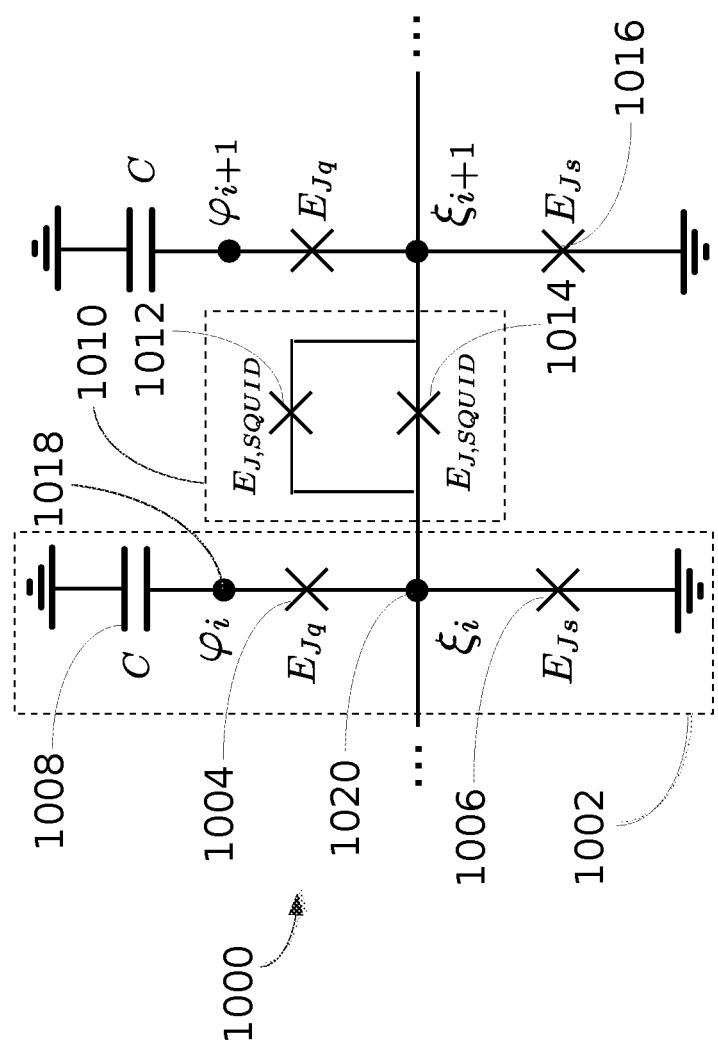
FIGS. 10A-B illustrate an example of a qubit circuit using SQUIDS as coupling devices with two-junction qubits.
Figure 10B:
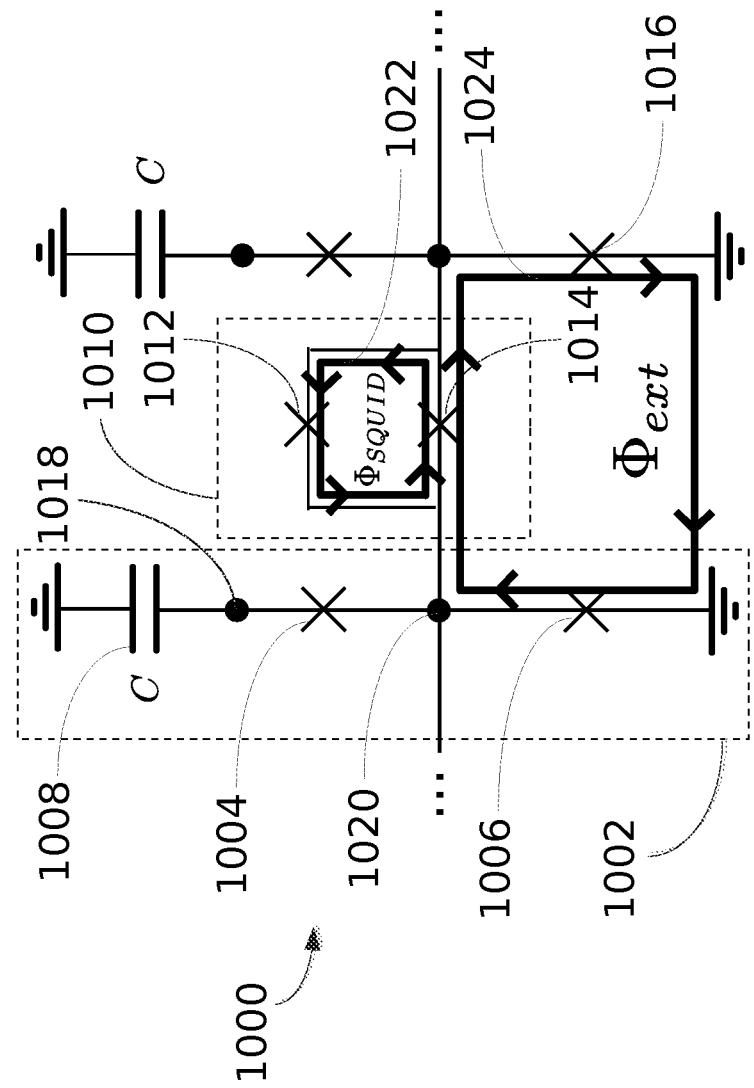

FIG. 10A illustrates an embodiment of a qubit circuit 1000 where physical qubits 1002 are two-junction qubits made of Josephson junctions 1004 and 1006 and capacitor 1008 and are connected together with coupling device 1010. The coupling device 1010 is a SQUID formed from two Josephson junctions 1012 and 1014. Josephson junctions 1012, 1014 have Josephson energy $E_{J,SQUID}$, while the two junctions 1004, 1006 have Josephson energy $E_{Jq}$ and $E_{Js}$ respectively. As shown in FIG. 10B, external magnetic fluxes $\phi_{ext}$ and $\phi_{SQUID}$ thread superconducting loops 1024, 1022 formed by junctions 1006-1014-1016 and 1012-1014, respectively.

Circuit nodes 1018, 1020 are associated with a node phase denoted by variables $\phi_i$ and $\xi_i$, respectively. The $\phi_i$ nodes 1018 are associated with a charge number $n_i$. The total Hamiltonian for such a qubit chain is:

$$H = \sum_{i=1}^{N}(4E_C n_i^2 - E_{Jq}\cos(\phi_i - \xi_i) - E_{Js}\cos\xi_i) - \sum_{i=1}^{N-1} E_{Jc}\cos(\xi_i - \xi_{i+1} - \phi_{ext}), \quad (13)$$

where $$E_{Jc} = 2E_{J,SQUID}\left|\cos\left(\frac{\pi\Phi_{SQUID}}{\Phi_0}\right)\right|$$

and $\phi_{ext}=2\pi\Phi_{ext}/\Phi_o$. The coupler 1010 and the junctions 1006 and 1016 form a flux qubit with a=$E_{Jc}/E_{Js}$. For a<0.5, the ground state of the flux qubit does not involve any persistent current such that the $\phi_i$ and $\xi_i$ are approximated as being small. In that case, the Hamiltonian may be rewritten by expanding the cosines to second-order Taylor series:

$$H = \sum_{i=1}^{N}\left(4E_C n_i^2 + E_{Jq}\left(\frac{\phi_i^2}{2} + \frac{\xi_i^2}{2} - \phi_i\xi_i\right) + E_{Js}\frac{\xi_i^2}{2}\right) + \sum_{i=1}^{N-1} E_{Jc}\left[\left(\frac{\xi_i^2}{2} + \frac{\xi_{i+1}^2}{2} - \xi_i\xi_{i+1}\right)\cos\phi_{ext} - (\xi_i - \xi_{i+1})\sin\phi_{ext}\right] \quad (14)$$

Since the $\xi_i$ nodes 1020 have no capacitance, a degree of freedom may be removed from the Hamiltonian by writing $\xi_i$ in terms of $\phi_i$. This is done by writing the Kirchoff current law at the coupling nodes:

$$E_{Jc} \sin(\xi_{i-1} - \xi_i + \phi_{ext}) + E_{Jq} \sin(\phi_i - \xi_i) = E_{Js} \sin(\xi_i) + E_{Jc} \sin(\xi_i - \xi_{i+1} + \phi_{ext}). \quad (15)$$

Expanding the sines to first order gives:

$$\phi_i = \frac{E_{Jq} + E_{Js} + 2E_{Jc}}{E_{Jq}}\xi_i + \frac{E_{Jc}}{E_{Jq}}(\xi_{i-1} + \xi_{i+1}). \quad (16)$$

This expression shows that in general, the coupling between the qubits 1002 is not limited to first nearest-neighbours. Indeed, the coupling term in the Hamiltonian is proportional to $\xi_{i+1}\xi_i$.

There exists a condition for which the coupling remains limited to next-nearest neighbours and the Hamiltonian is greatly simplified. Indeed, when $E_{Jc} \ll E_{Jq}$, the following can be approximated:

$$\phi_i \approx \frac{E_{Jq} + E_{Js} + 2E_{Jc}}{E_{Jq}}\xi_i. \quad (17)$$

Defining $$a = \frac{E_{Jq}}{E_{Jq} + E_{Js} + 2E_{Jc}},$$

the Hamiltonian may be rewritten as:

$$H = \sum_{i=1}^{N}\left(4E_C n_i^2 + E_{Jq}(a-1)^2\frac{\phi_i^2}{2} + E_{Js}a^2\frac{\phi_i^2}{2}\right) + \sum_{i=1}^{N-1} E_{Jc}\left[a^2\left(\frac{\phi_i^2}{2} + \frac{\phi_{i+1}^2}{2} - \phi_i\phi_{i+1}\right)\cos\phi_{ext} - a(\phi_i - \phi_{i+1})\sin\phi_{ext}\right] \quad (18)$$

If the circuit 1000 is operated in the regime where $E_{Jq} \gg E_{Jc}$ & $E_{Js}$, and $a \approx 1$, then we retrieve the Hamiltonian of equation (2). Indeed, when $E_{Jq} \gg E_{Js}$, the inductance of the junction $E_{Jq}$ is very small compared to the other inductances of the circuit 1000 and can thus be considered as a short circuit. Using circuit 1000 with $a \approx 1$ instead of circuit 300 may allow the individual qubit frequency to be separately tuned in the non-topological regime, assuming junction 1004 is implemented as a SQUID, since this junction is decoupled from the flux bias of the superconducting loop 1024.

In order to find the condition to obtain deep strong coupling using the architecture of FIGS. 10A-10B, the effective Josephson energy $\tilde{E}_J$ for $\phi_{ext} = \pi$ is:

$$\tilde{E}_J = (a-1)^2 E_{Jq} + a^2 E_{Js} - 2a^2 E_{Jc}. \quad (19)$$

The condition for deep strong coupling is:

$$\tilde{E}_J < a^2 E_{Jc}. \quad (20)$$

If $a \approx 1$, this condition implies $E_{Jc}/E_{Js} > \frac{1}{3}$, consistent with the condition previously derived for the circuit 300 of FIG. 3.

Replacing the junctions 1016 and 1006 by superconducting inductors (i.e. replacing the two-junction qubits 1002 by inductively shunted qubits) would lead to a similar result.

Figure 11:
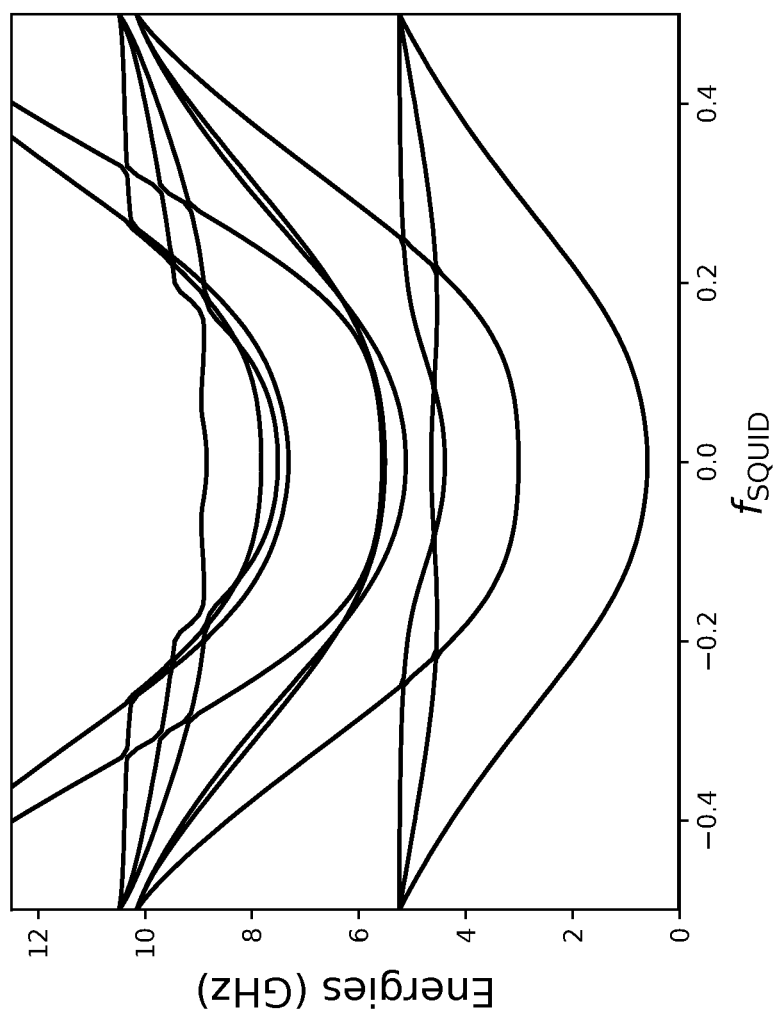
FIG. 11 is a graph of the energy spectrum of a 3-qubit circuit as a function of the magnetic frustration in the coupling SQUID, in accordance with some embodiments.

The energy spectrum of the coupled qubits 1002 as a function of the flux applied to the superconducting loop 1022, as per the embodiment of FIGS. 10A-10B, was simulated. The results of the simulation are illustrated in FIG. 11, where the spectrum of three coupled qubits 1002 is shown. Here, $E_{J,SQUID} = 4.5$ GHz, $E_{Js} = 20$ GHz and $E_{Jq} = 80$ GHz, while $\phi_{ext} = \pi$. The spectrum is very similar to the spectrum of FIG. 4, showing that adding an extra node for every qubit does not affect the physics of the coupling. This extra node may make the qubit less sensitive to external flux fluctuations.

Figure 12A:
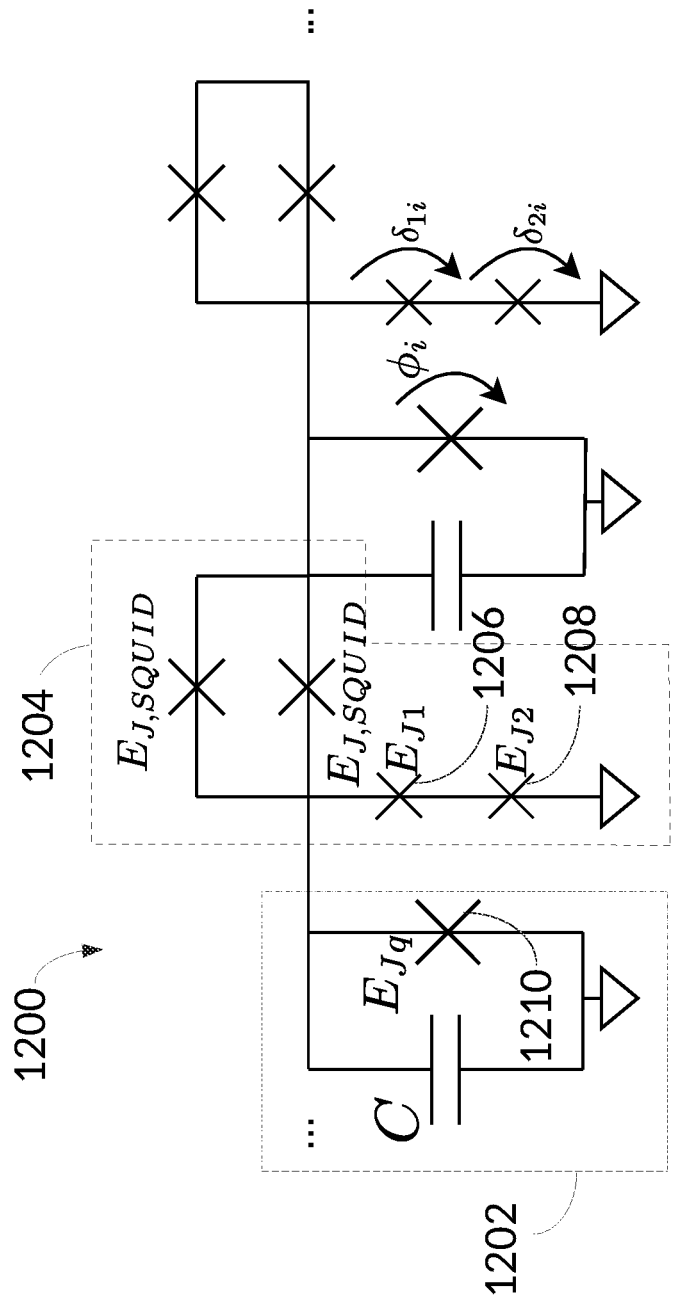
FIGS. 12A-B illustrate an example of a qubit circuit using a SQUID and two Josephson junctions in series as coupling devices.
Figure 12B:
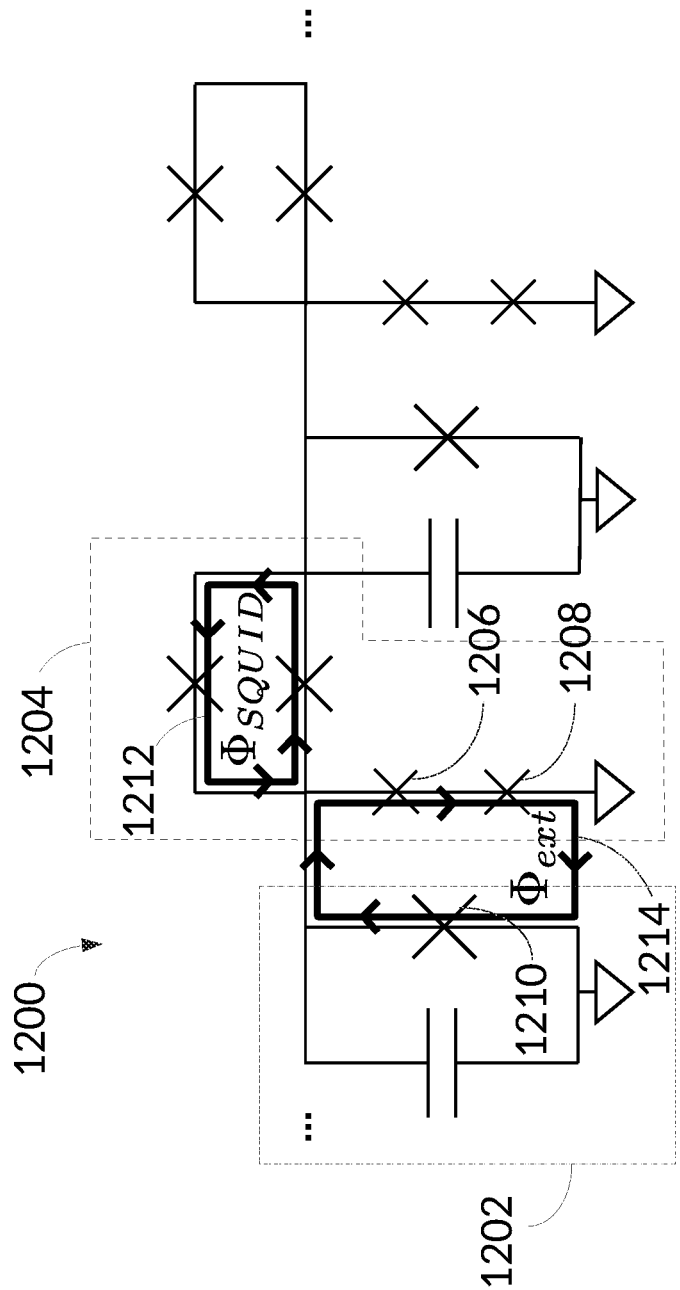

All coupler designs presented hereinabove exhibited anti-ferromagnetic coupling (i.e. J<0). FIG. 12A shows a design allowing for ferromagnetic coupling. Qubit 1202 is coupled to coupling device 1204. Junctions 1206 and 1208 with Josephson energies $E_{J1}$ and $E_{J2}$, respectively, connected in series are added in parallel with the junction 1210 of Josephson energy $E_{Jq}$. As shown in FIG. 12B, the three junctions 1206, 1208, 1210 define a superconducting loop 1214 on which the external flux $\Phi_{ext}$ is applied. Another superconducting loop 1212 is also formed within the coupling device 1204.

We refer to the phase difference on junctions 1206, 1208, 1210 as $\delta_{1i}$, $\delta_{2i}$ and $\phi_i$ respectively. Considering the quantization of the phase around the superconducting loop threaded by the external flux, we have:

$$\delta_{1i} + \delta_{2i} - \phi_i - \phi_{ext} = 0 (\text{mod } 2\pi), \quad (21)$$

where we have defined $\phi_{ext} = 2\pi\Phi_{ext}/\Phi_0$. For the rest of this derivation, we will assume that $\phi_{ext} = \pi$.

The problem has a second constraint: that the current in junctions 1206, 1208 in series must be the same, which means that:

$$E_{J1} \sin \delta_{1i} = E_{J2} \sin \delta_{2i}. \quad (22)$$

We now assume that $E_{J1} \gg E_{J2}$. As a result, $\delta_{1i}$ is limited to very small values around zero and $\delta_{2i}$ approaches $\pi$ due to the external flux. Combining equations (21) and (22) and assuming $\phi_{ext} = \pi$, we have:

$$E_{J1} \sin \delta_{1i} = -E_{J2} \sin(-\delta_{1i} + \phi_i). \quad (23)$$

Using a first order Taylor expansion we find:

$$\delta_{1i} = \frac{-E_{J2}}{E_{J1} - E_{J2}}\phi_i, \quad (24)$$

$$\delta_{2i} = \frac{E_{J1}}{E_{J1} - E_{J2}}\phi_i + \pi. \quad (25)$$

We now write the Hamiltonian:

$$H = \sum_{i=1}^{N}(4E_C n_i^2 - E_{Jq}\cos\phi_i - E_{J1}\cos\delta_{1i} - E_{J2}\cos\delta_{2i}) - \sum_{i=1}^{N-1} E_{Jc}\cos(\phi_i - \phi_{i+1}) \quad (26)$$

$$H = \sum_{i=1}^{N}(4E_C n_i^2 - E_{Jq}\cos\phi_i - E_{J1}\cos\delta_{1i} + E_{J2}\cos(\delta_{2i} - \pi)) - \sum_{i=1}^{N-1} E_{Jc}\cos(\phi_i - \phi_{i+1}), \quad (27)$$

where in equation (27) we have shifted the argument of the cosine on the $E_{J2}$ term to make sure the argument is close to zero. We can now replace $\delta_{1i}$ and $\delta_{2i}$ by their equivalent in terms of $\phi_i$ and expand the cosine terms to second order to find:

$$H = \sum_{i=1}^{N}\left(4E_C n_i^2 + \left(E_{Jq} - \frac{E_{J1}E_{J2}}{E_{J1}-E_{J2}} + 2E_{Jc}\right)\frac{\phi^2}{2}\right) - \sum_{i=1}^{N-1} E_{Jc}\phi_i\phi_{i+1}. \quad (28)$$

We can now define an effective Josephson energy $\tilde{E}_J$ and qubit impedance r as:

$$\tilde{E}_J = E_{Jq} - \frac{E_{J1}E_{J2}}{E_{J1}-E_{J2}} + 2E_{Jc} \quad (29)$$

and $$r = \sqrt{\frac{8E_C}{\tilde{E}_J}}. \quad (30)$$

The Hamiltonian can be rewritten using Pauli operators as:

$$H = -\sum_{i=1}^{N} h\sigma_i^z - \sum_{i=1}^{N-1} J\sigma_i^x\sigma_{i+1}^x \quad (31)$$

with $h = r\tilde{E}_J/2$ and $J = r\, E_{Jc}/2$.

From that, we find that the condition for deep strong coupling and topological order leads to:

$$E_{Jc} < \frac{E_{J1}E_{J2}}{E_{J1}-E_{J2}} - E_{Jq}. \quad (32)$$

This implies that $$\frac{E_{J1}E_{J2}}{E_{J1}-E_{J2}}$$

is larger than $E_{Jq}$ for positive $E_{Jc}$.

Equations (23) to (32) were derived assuming $E_{J1} \gg E_{J2}$. Having instead $E_{J1} \ll E_{J2}$ leads to a swapping of $E_{J1}$ and $E_{J2}$ in the equations. Replacing either $E_{J1}$ or $E_{J2}$ by a superconducting inductor would also give a similar result.

Figure 13:
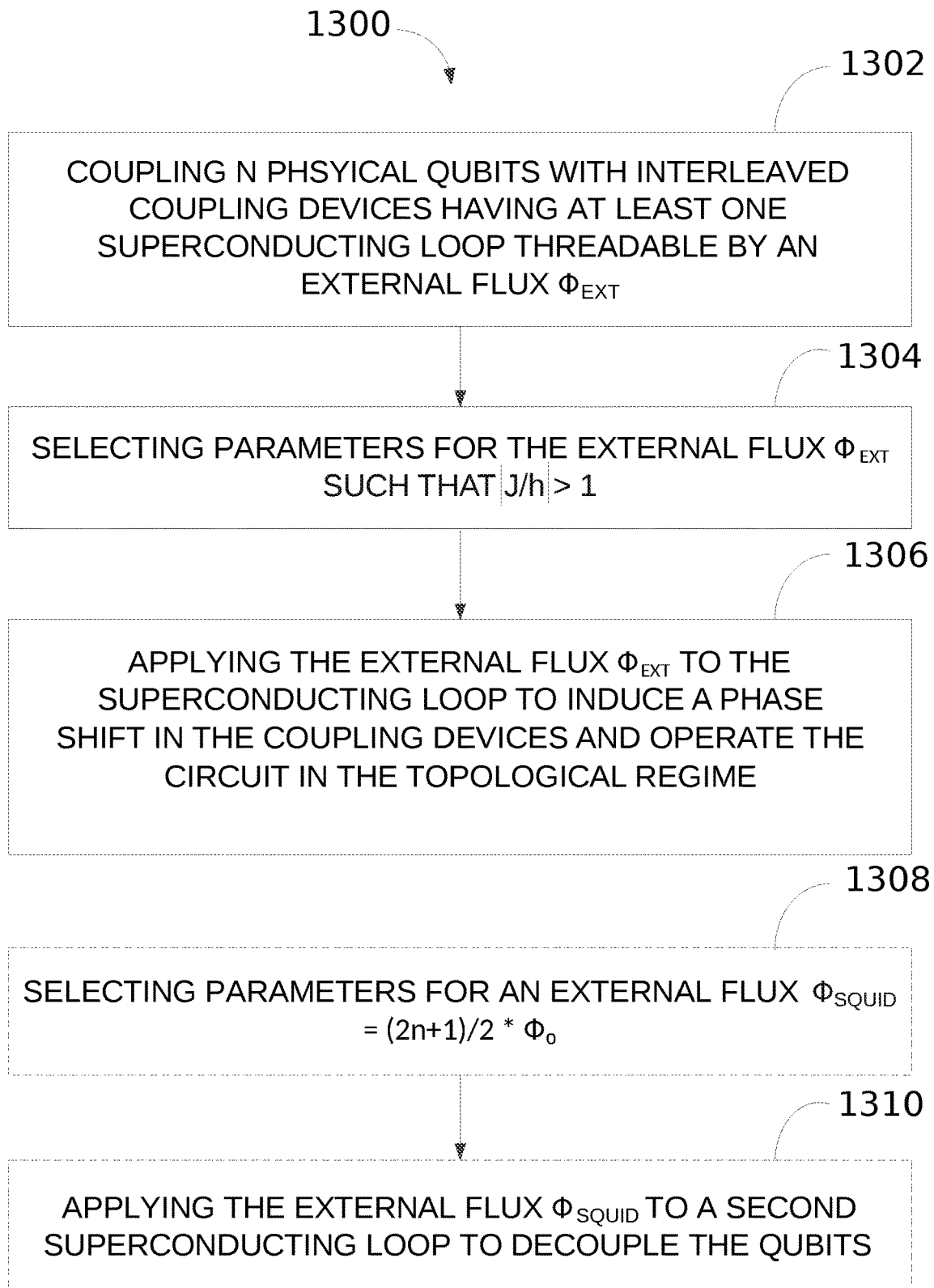
FIG. 13 is a flowchart of a method for topological protection of quantum information in a qubit circuit, in accordance with some embodiments.

As will be understood, the circuits 100, 300, 700, 800, 900, 1000, 1200 may be operated as topologically protected qubit circuits. FIG. 13 illustrates a method 1300 for topological protection of quantum information in a qubit circuit, such as circuits 100, 300, 700, 800, 900, 1000, 1200. At step 1302, a plurality of physical qubits, such as qubits 102, 308, 704, 802, 902, 1002, 1202, are coupled with a plurality of interleaved coupling devices, such as coupling devices 104, 302, 702, 804, 904, 1010, 1204. In some embodiments, the qubits each comprise at least one capacitor and at least one Josephson junction connected together, as illustrated in the embodiments of FIGS. 2A-2D. The coupling devices each comprise at least one superconducting loop threadable by an external flux $\phi_{ext}$.

At step 1304, parameters are selected for the external flux $\phi_{ext}$ such that $$\left|\frac{J}{h}\right| > 1,$$

where J is the coupling devices and h is the energy of the physical qubits. In some embodiments, selecting parameters as per step 1304 comprises selecting $\phi_{ext}$ to induce a phase shift with a value between $\pi/2$ and $3\pi/2$ (mod $2\pi$) in at least one Josephson junction of the qubit circuit. In some embodiments, selecting parameters as per step 1304 comprises selecting $\phi_{ext}$ to induce a phase shift of $\pi$ (mod $2\pi$) in at least one Josephson junction of the qubit circuit.

At step 1306, the external flux $\phi_{ext}$ is applied to the at least one superconducting loop to induce a phase shift in the coupler and operate the circuit in a topological regime. In some embodiments, $\phi_{ext}$ is selected to induce a phase shift of $\pi$ in the coupler.

In some embodiments, the qubit circuit comprises at least a first superconducting loop threadable by the external flux $\phi_{ext}$, and at least a second superconducting loop threadable by an external flux $\phi_{SQUID}$. The method 1300 may thus, in some embodiments, also comprise a step 1308 of selecting parameters for the external flux $\phi_{SQUID}$, and/or a step 1310 of applying the external flux $\phi_{SQUID}$ to the second superconducting loop. The parameters for $\phi_{amp}$ may be selected such that $\phi_{SQUID} = (2n+1)/2 * \phi_o$, where n is an integer and $\phi_o$ is the flux quantum.

The qubits may be decoupled and operated as individual physical qubits with the appropriate choice of external flux $\phi_{SQUID}$. In some embodiments, $\phi_{SQUID} = +/-0.5\,\phi_o$ provides such capability. A flux $\phi_{SQUID} = (2n+1)/2 * \phi_o$ can also be applied only to selected couplers. For example, if a flux $\phi_{SQUID} = (2n+1)/2 * \phi_o$ is applied to a coupler in the middle of a chain of N coupled qubits (N even), then the topological qubit can be broken into two topological qubits each made of N/2 physical qubits.

The flux in the SQUID of one coupler may be changed from a value of $(2n+1)/2 * \phi_o$ to a different value. For example, the flux in a coupler between two chains of N/2 coupled physical qubits can be modified to a value different from $(2n+1)/2 * \phi_o$, such as a value of $n\phi_o$, in order to convert the two topological qubits made of N/2 physical qubits into a single one made of N qubits.

In general, the strength of the coupling can be modulated by modulating $\phi_{SQUID}$. In some embodiments, $\phi_{SQUID}$ is changed adiabatically to ensure that the symmetry of the wave function is preserved during the procedure.

Although illustrated as sequential, the steps 1304-1310 of the method 1300 may be performed in any desired order, and in some cases concurrently. For example, parameters for both fluxes may be selected concurrently, as per steps 1304 and 1308, but applied sequentially as a function of a desired implementation. Steps 1306 and 1310 will necessarily be performed sequentially, but not necessarily in the order illustrated.

Various aspects of the circuits and methods described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. In addition, all of the embodiments described above with regards to circuit 100 may be used conjointly with the method 1300.

Although particular embodiments have been shown and described, it will be apparent to those skilled in the art that changes and modifications may be made without departing from this invention in its broader aspects. The scope of the following claims should not be limited by the embodiments set forth in the examples, but should be given the broadest reasonable interpretation consistent with the description as a whole.

The invention claimed is:

1. A topological superconducting qubit circuit comprising:
    a plurality of physical superconducting qubits;
    a plurality of coupling devices interleaved between pairs of the physical superconducting qubits, the coupling devices tunable to operate the qubit circuit in a topological regime and as a series of individual physical qubits, wherein energy of the coupling devices is greater than energy of the physical superconducting qubits when the qubit circuit operates in the topological regime; and
    at least two superconducting loops per coupling device, each one of the at least two loops threadable by an external flux.

2. The circuit of claim 1, further comprising at least one component for generating a magnetic field for inducing the external flux in the at least two superconducting loops.

3. The circuit of claim 2, wherein the at least one component comprises two transmission lines, each one coupled to one of the at least two superconducting loops through a mutual inductance.

4. The circuit of claim 1, wherein each one of the physical superconducting qubits is composed of at least one capacitor and at least one Josephson junction connected together.

5. The circuit of claim 4, wherein the at least one Josephson junction is part of a SQUID.

6. The circuit of claim 4, wherein the at least one capacitor and the at least one Josephson junction are connected together at a first node, and the coupling devices are connected to the physical qubits at the first node.

7. The circuit of claim 6, wherein one of the at least two superconducting loops comprises a second node having a same superconducting phase as the first node.

8. The circuit of claim 4, wherein the at least one capacitor and the at least one Josephson junction are connected together at a first node, and the coupling devices are connected to the physical qubits at a second node different from the first node.

9. The circuit of claim 8, wherein one of the at least two superconducting loops comprises a third node having a same superconducting phase as the second node.

10. The circuit of claim 1, wherein one of the at least two superconducting loops is a loop of superconducting material interrupted by a SQUID.

11. The circuit of claim 10, wherein a second one of the at least two superconducting loops is interrupted by a Josephson junction of the SQUID.

12. A method for topological protection of quantum information in a qubit circuit, the method comprising:
    coupling a plurality of physical qubits with a plurality of interleaved coupling devices, each one of the coupling devices comprising at least one superconducting loop threadable by an external flux $\phi_{ext}$;
    selecting parameters for the external flux $\phi_{ext}$ such that $|J/h|>1$, where J is a coupling device energy and h is a physical qubit energy; and
    applying the external flux $\phi_{ext}$ to the at least one superconducting loop to induce a phase shift in the coupling devices and operate the qubit circuit in a topological regime.

13. The method of claim 12, wherein selecting parameters for the external flux $\phi_{ext}$ comprises selecting $\phi_{ext}$ to induce a phase shift with a value between $\pi/2$ and $3\pi/2$ (mod $2\pi$) in at least one Josephson junction of the qubit circuit.

14. The method of claim 12, wherein selecting parameters for the external flux $\phi_{ext}$ comprises selecting $\phi_{ext}$ to induce a phase shift of $\pi$ (mod $2\pi$) in at least one Josephson junction of the qubit circuit.

15. The method of claim 12, further comprising applying an external flux $\phi_{SQUID}$ to a second superconducting loop of at least one of the plurality of coupling devices.

16. The method of claim 15, wherein applying the external flux $\phi_{SQUID}$ comprises applying the external flux $\phi_{SQUID}$ to the second superconducting loop of all of the plurality of coupling devices.

17. The method of claim 15, further comprising selecting parameters for $\phi_{SQUID}=(2n+1)/2*\phi_o$, where n is an integer and $\phi_o$ is a flux quantum.

18. The method of claim 15, further comprising modulating $\phi_{SQUID}$ for at least one of the plurality of coupling devices.

19. The method of claim 18, wherein modulating $\phi_{SQUID}$ comprises changing $\phi_{SQUID}$ adiabatically.

20. The method of claim 18, wherein modulating $\phi_{SQUID}$ comprises changing $\phi_{SQUID}$ from $(2n+1)/2*\phi_o$ to another value, where n is an integer and $\phi_o$ is a flux quantum.

* * * * *